(12) United States Patent
Potocná et al.

(10) Patent No.: US 11,289,785 B2
(45) Date of Patent: Mar. 29, 2022

(54) PHASING LINE HOLDERS

(71) Applicant: CommScope Technologies LLC, Hickory, NC (US)

(72) Inventors: Katarina Potocná, Horní Redice (CZ); Frantisek Ondrácek, Pardubice (CZ); Libor Strachon, Holice (CZ); Tomás Thér, Police nad Metuji (CZ)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/924,394

(22) Filed: Jul. 9, 2020

(65) Prior Publication Data

US 2021/0036680 A1 Feb. 4, 2021

Related U.S. Application Data

(60) Provisional application No. 62/912,943, filed on Oct. 9, 2019, provisional application No. 62/881,067, filed on Jul. 31, 2019.

(51) Int. Cl.
*H01P 3/02* (2006.01)
*H01P 11/00* (2006.01)
*H03H 9/05* (2006.01)
*H03H 9/02* (2006.01)

(52) U.S. Cl.
CPC .............. *H01P 3/02* (2013.01); *H01P 11/001* (2013.01); *H03H 9/02653* (2013.01); *H03H 9/0566* (2013.01)

(58) Field of Classification Search
CPC .... H03H 9/02653; H03H 9/0566; H01P 3/02; H01P 11/001

USPC .......................................... 333/236, 239, 245
See application file for complete search history.

(56) References Cited

U.S. PATENT DOCUMENTS

| 4,365,195 A * | 12/1982 | Stegens ..................... G01R 1/04 324/750.25 |
| 5,329,687 A | 7/1994 | Scott et al. |
| 5,973,262 A | 10/1999 | Matubara |
| 6,392,506 B2 | 5/2002 | Wulff |

(Continued)

FOREIGN PATENT DOCUMENTS

| EP | 1544938 A1 | 6/2005 |
| JP | 2010080213 A | 4/2010 |
| KR | 20180117897 A | 10/2018 |

OTHER PUBLICATIONS

International Searching Authority, "International Search Report and Written Opinion from PCT Application No. PCT/US2020/041314", from Foreign Counterpart to U.S. Appl. No. 16/924,394, filed Oct. 23, 2020, pp. 1 through 10, Published: WO.

*Primary Examiner* — Rakesh B Patel
*Assistant Examiner* — Jorge L Salazar, Jr.
(74) *Attorney, Agent, or Firm* — Fogg & Powers LLC

(57) ABSTRACT

Systems and methods for phasing line holders are described herein. In certain embodiments, an apparatus includes a groove in a conductive body. Additionally, the apparatus includes a phasing line for electrically coupling a plurality of components, the phasing line extending through the groove. Further, the apparatus includes a holder inserted into the groove, the holder maintaining the phasing line at a specific position in relation to a plurality of groove surfaces, wherein a plurality of holder surfaces apply sufficient pressure to the plurality of groove surfaces to secure the holder within the groove.

20 Claims, 15 Drawing Sheets

(56) References Cited

U.S. PATENT DOCUMENTS

2011/0063049 A1* 3/2011 Bradley ............ H01R 13/5812
                                                    333/161
2012/0115015 A1   5/2012 Park et al.
2014/0153211 A1   6/2014 Malek et al.

* cited by examiner

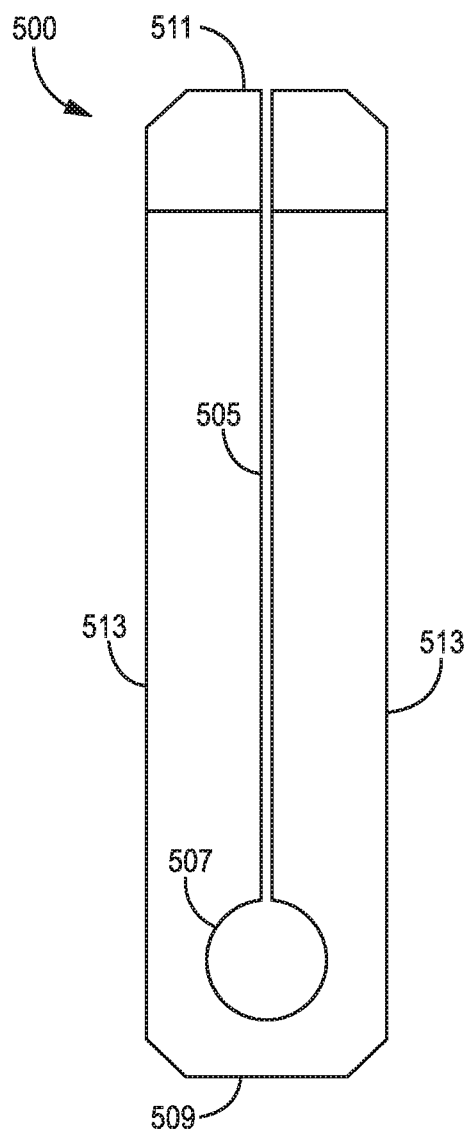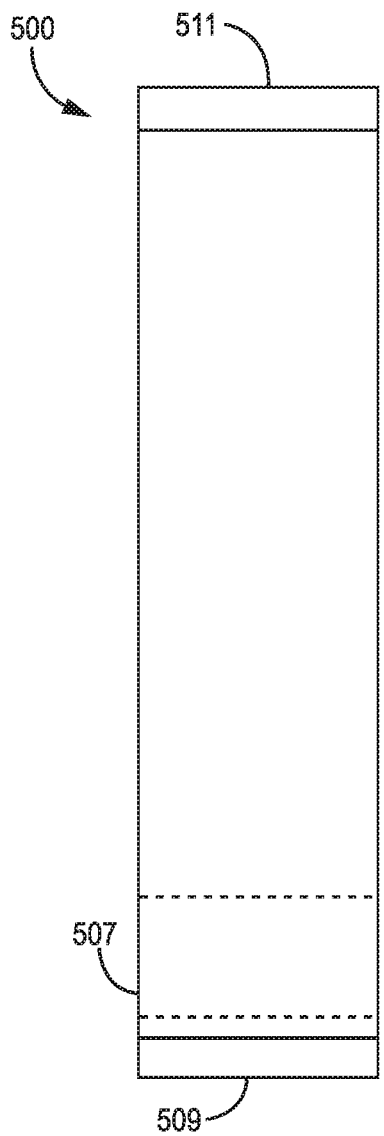
FIG. 5A  FIG. 5B
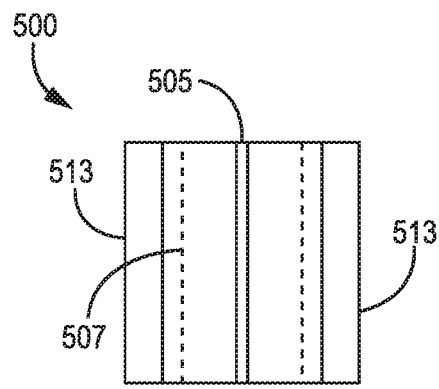
FIG. 5C

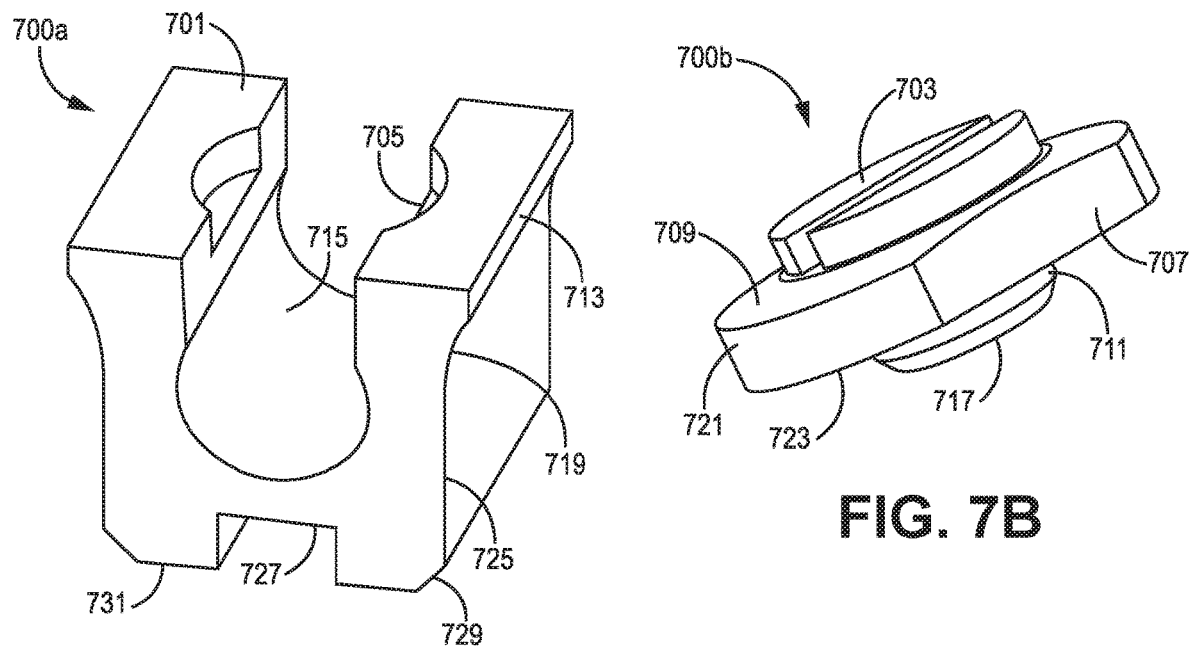
FIG. 7A
FIG. 7B
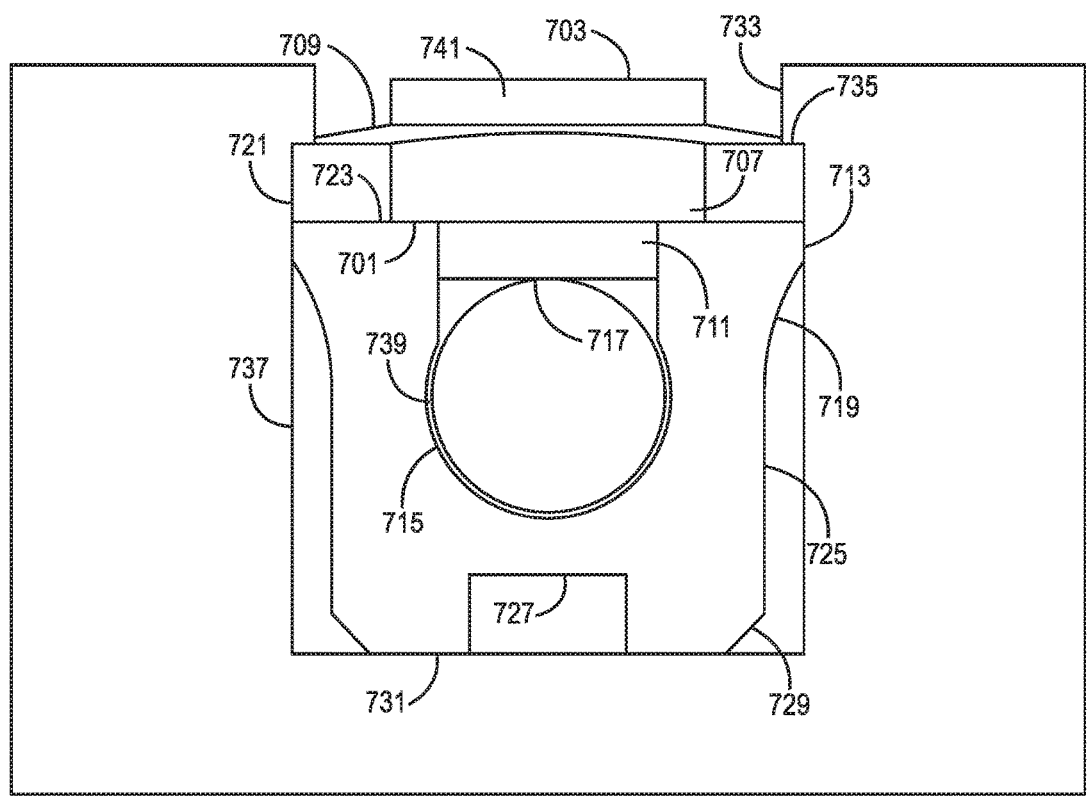
FIG. 8A

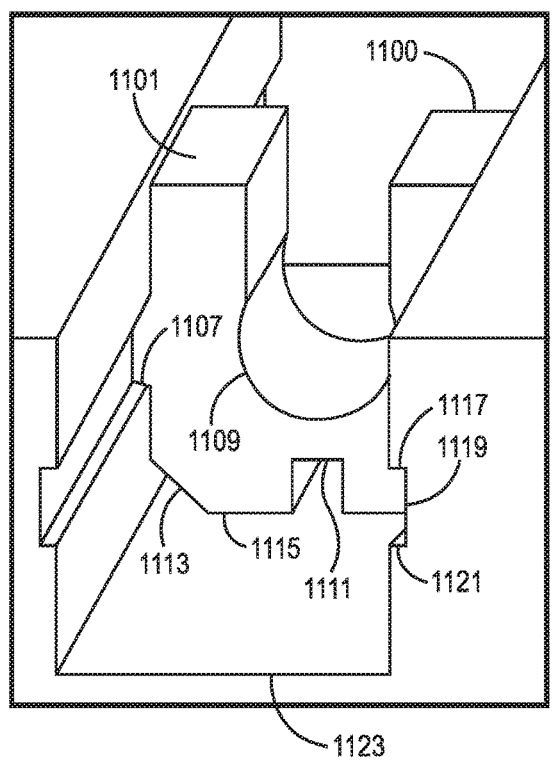 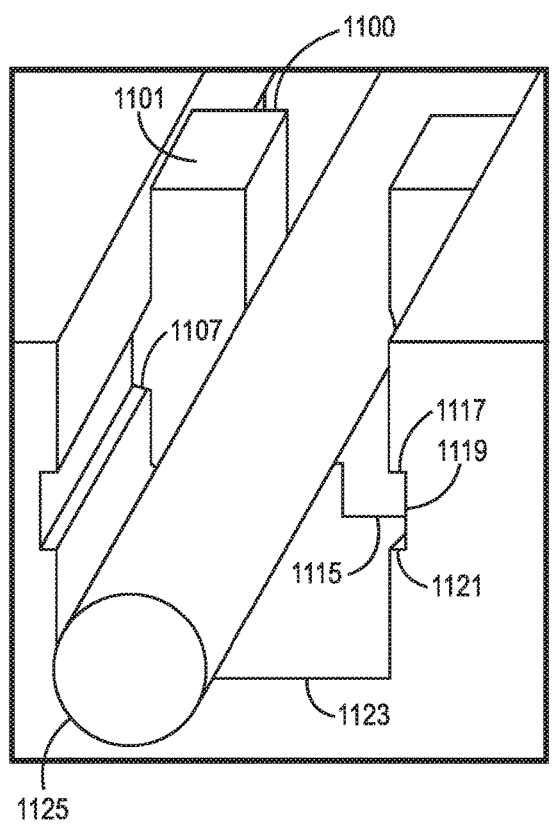
FIG. 12A  FIG. 12B

PHASING LINE HOLDERS

CROSS-REFERENCE TO RELATED APPLICATIONS

This application claims the benefit of U.S. Provisional Patent Application Ser. No. 62/912,943, entitled "filed on Oct. 9, 2019, is related to U.S. Provisional Patent Application No. 62/881,067 entitled "PHASING LINE HOLDERS" filed on Jul. 31, 2019, which is incorporated herein by reference in its entirety.

BACKGROUND

Many communication systems include filters and/or duplexers that are coupled to one or more antennas. Each duplexer or filter may be coupled by a system of transmission lines to the antenna(s), e.g., using a trunk branch architecture. Some of these transmission lines may also be referred to as phasing lines. In some systems, the phasing lines may connect filters, duplexers, and antennas that operate with more than one band. Accordingly, the shape of the phasing lines and the shape of the structure surrounding the phasing lines may be designed to provide impedance matching for the communication system's components.

Frequently, the shape of the phasing lines and the shape of the containing grooves may be complex. Additionally, the phasing lines may be precisely located within grooves for impedance matching purposes. For example, the phasing lines' position may be fixed within grooves to maintain 50 Ohm impedance throughout the phasing line. Frequently, to maintain a fixed position for the phasing line within a groove, holders may be placed within the groove to secure the phasing line at specific positions with respect to the bottom and sides of the containing groove.

SUMMARY

Systems and methods for phasing line holders are provided herein. In certain embodiments, an apparatus includes a groove in a conductive body. The apparatus further includes a phasing line for electrically coupling a plurality of components, the phasing line extending through the groove. Additionally, the apparatus includes a holder inserted into the groove, the holder maintaining the phasing line at a specific position in relation to a plurality of groove surfaces, wherein a plurality of holder surfaces apply sufficient pressure to the plurality of groove surfaces to secure the holder within the groove.

DRAWINGS

Understanding that the drawings depict only some embodiments and are not, therefore, to be considered limiting in scope, the exemplary embodiments will be described with additional specificity and detail using the accompanying drawings, in which:

FIGS. 5A-5C are diagrams illustrating one embodiment of a phasing line holder according to an aspect of the present disclosure;

FIGS. 7A-7B are diagrams illustrating one embodiment of a phasing line holder according to an aspect of the present disclosure;

FIGS. 8A-8C are diagrams illustrating the securing of a phasing line within a phasing line holder according to an aspect of the present disclosure;

FIGS. 12A-12B are diagrams illustrating the securing of a phasing line within a phasing line holder according to an aspect of the present disclosure;

In accordance with common practice, the various described features are not drawn to scale but are drawn to emphasize specific features relevant to the example embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized, and that logical, mechanical, and electrical changes may be made.

Systems and methods for securing phasing lines within grooves using phasing line holders are described herein. For example, a phasing line may be placed within a holder that is positioned within a groove, where the holder is secured within the groove by the application of pressure by the holder to one or more surfaces of the groove. In some embodiments, an object is inserted into a slot formed in the holder that pushes the side surfaces of the holder against the surfaces of the groove. Alternatively, the holder may have a holder base and securing mechanism, where the holder base supports the phasing line, and the securing mechanism can be moved to apply pressure to the surfaces of the groove. Additionally, the phasing line may exert a force against the holder that causes surfaces of the holder to exert pressure against one or more surfaces of the groove. In certain embodiments, the groove may be shaped to accommodate different shapes of the holders placed within the groove. Thus, a holder may be positioned and secured at a location in the groove such that the phasing line running through the holder is precisely fixed at the desired position in relation to the groove.

Phasing lines and holders, described herein, may be used within any type of communication system configured to operate in one or more frequency bands, such as a cellular base station like an LTE eNodeB used in a cellular network or a repeater device (such as a remote antenna unit of a distributed antenna system (DAS) or a single-node repeater). However, for pedagogical reasons, the description of some embodiments is presented below in connection with a wireless communications device generally, and a remote antenna unit of a DAS specifically. Nonetheless, it is to be understood that the techniques described herein can be used with wireless communications devices other than remote antenna units.

Figure 1A:
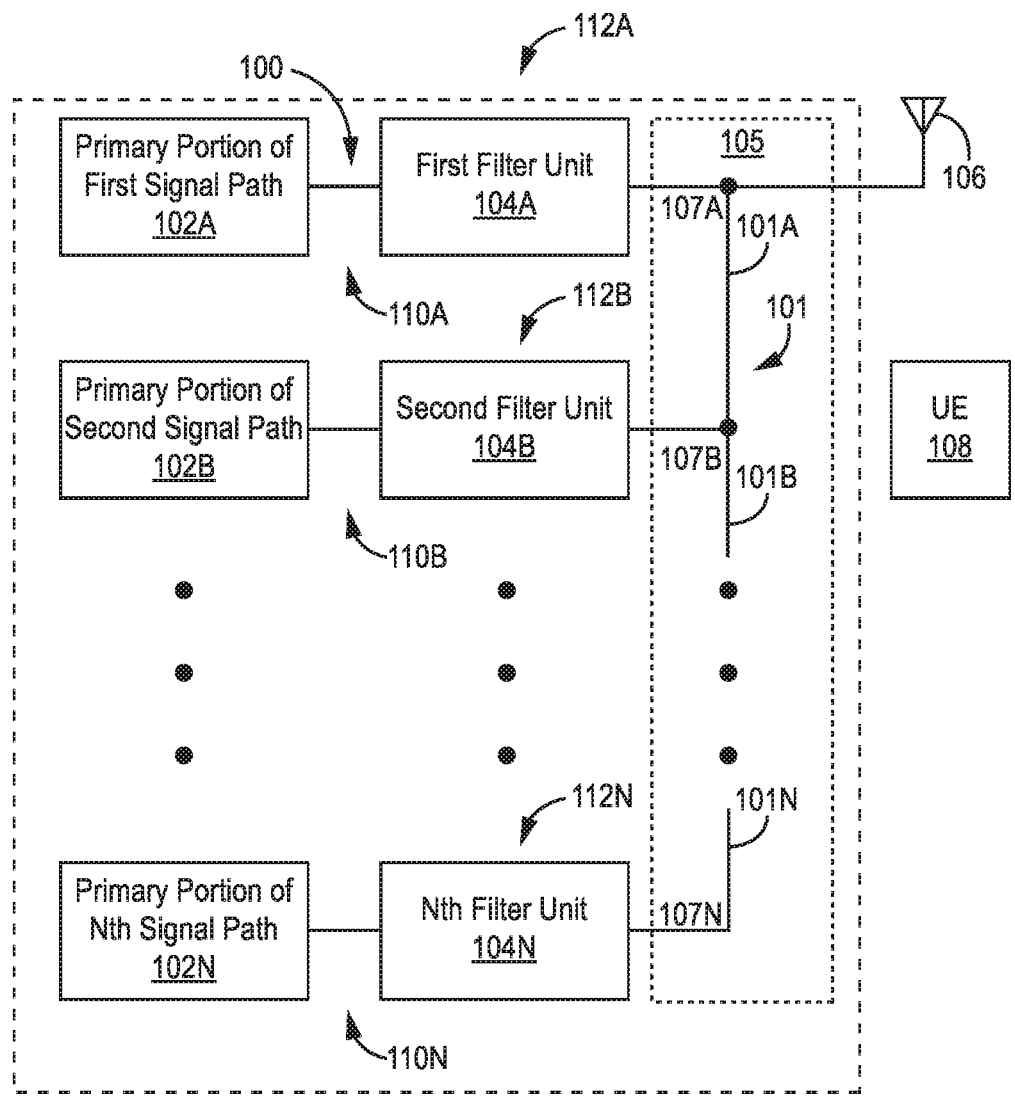
FIG. 1A illustrates a block diagram of an exemplary embodiment of a wireless communication device according to an aspect of the present disclosure.

FIG. 1A illustrates a block diagram of one embodiment of a wireless communications device 100 made according to one embodiment described in the present disclosure. The wireless communications device 100 may comprise any communications device that employs one or more filter units. Examples of the wireless communications device 100 may include, for example, a cellular base station, a repeater device, and the like. In the illustrated embodiment, the wireless communications device 100 may be configured to facilitate wireless communications with at least one other wireless communications device, such as user equipment (UE) 108, through at least one signal path.

Figure 1B:
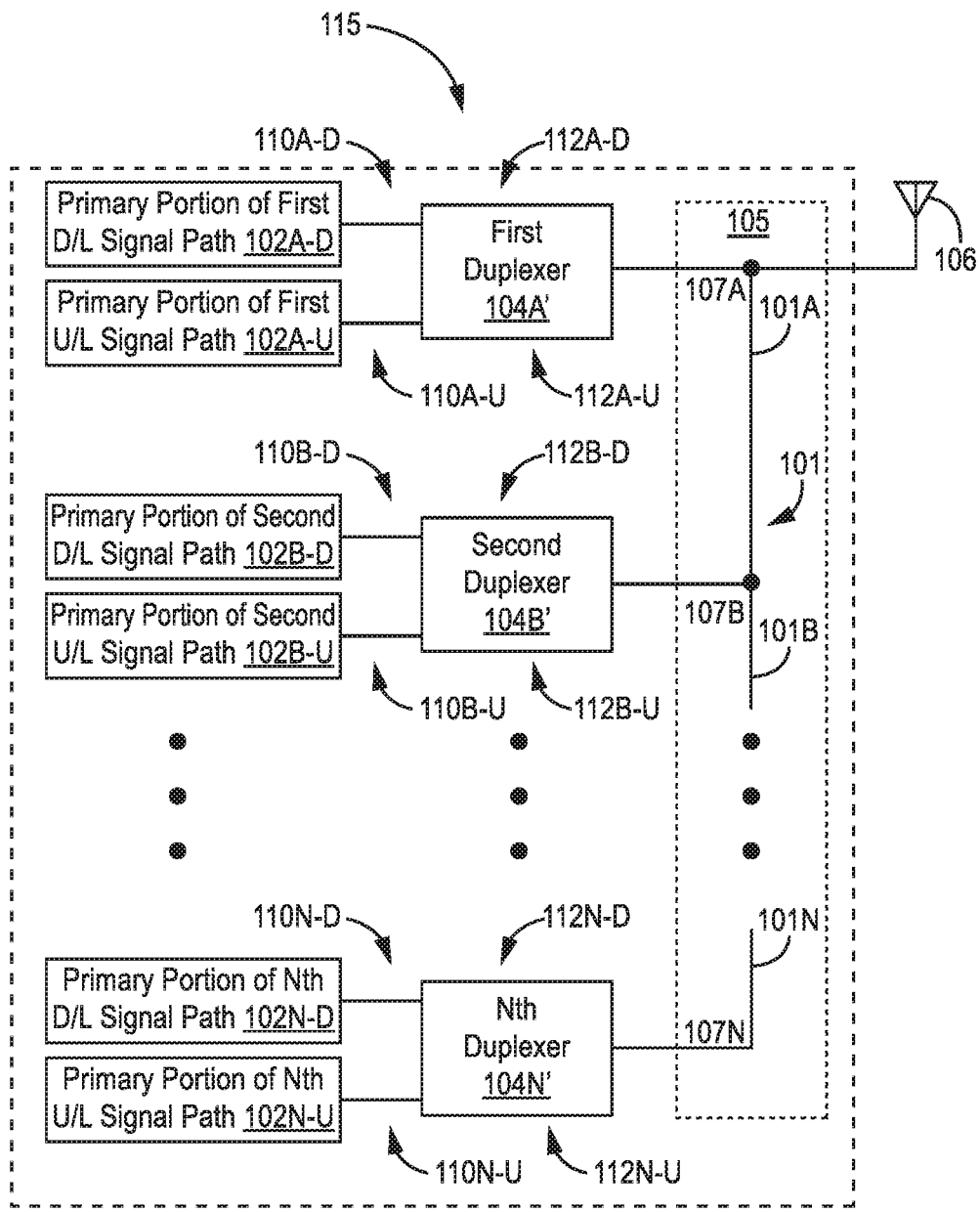
FIG. 1B illustrates a block diagram of one embodiment of a remote antenna unit made according to an aspect of the present disclosure.

The wireless communications device 100 may comprise N signal paths 110A, 110B, and 110N. Each signal path 110A, 110B, and 110N may include a corresponding primary portion 102A, 102B, and 102N coupled to a corresponding filter unit 104A, 104B, and 104N. As illustrated in FIGS. 1A and 1B, there are three signal paths; however, N may be an integer greater than or equal to one.

Each signal path 110A, 110B, and 110N includes at least one of an uplink signal path and a downlink signal path. The downlink signal path is configured to output one or more downlink radio frequency signals radiated from one or more antennas 106 associated with the wireless communication device 100 for reception by the at least one other wireless communications device (UE) 108. The uplink signal path 104 is configured to receive one or more uplink radio frequency signals transmitted from the at least one wireless communications device 108. For example, where the wireless communications device 100 is implemented as a base station or access point, the downlink and uplink signal paths are configured to perform all Layer-3, Layer-2, and Layer-1 processing and operations required by the relevant wireless interface that are necessary to generate and transmit the downlink radio frequency signals and to receive, demodulate, and decode the uplink radio frequency signals, respectively.

In other embodiments where the wireless communications device 100 is implemented as a repeater device (such as a remote antenna unit of a DAS or a single-node repeater), the downlink and uplink signal paths are configured to perform at least some of the repeater processing or operations necessary to output the downlink radio frequency signals as a repeated version of downlink radio frequency signals originally transmitted by one or more other base stations or access points and to receive the uplink radio frequency signals and output a repeated version of the uplink radio frequency signals that are communicated to the one or more base stations or access points, respectively. As used herein, "downlink" refers to the direction of signal flow from the wireless communications device 100, through the antenna(s) 106, and toward the other wireless communications device 108, and "uplink" refers to the direction of signal flow from the other wireless communications device 108, through the antenna(s) 106, and toward the wireless communications device 100.

Each filter unit 104A, 104B, and 104N comprises one or more filters, such as bandpass filters. Optionally, a filter unit 104A, 104B, and 104N may be an n-plexer. An n-plexer comprises n filters having unique 3 dB passbands that do not overlap; n is an integer greater than or equal to two. For example, n may be two, and the filter unit would be a duplexer. For an n-plexer, such as a duplexer, each primary portion of an uplink path and each primary portion of a downlink path is coupled to a unique filter of the n-plexer. Thus, the n-plexer provides isolation between such paths.

Typically, for a duplexer, the primary portion of an uplink path and the primary portion of a corresponding downlink path are coupled to unique filters of the duplexer. Thus, the duplexer provides isolation between the primary portion of the uplink path and the primary portion of the downlink path.

A transmission line system 105 may couple at least one antenna 106 to each filter unit 104A, 104B, and 104N. Each of the one or more antennas 106 and the transmission line system 105 may or may not be part of the wireless communications device 100. Each secondary portion 112A, 112B, and 112N of each signal path 110A, 110B, and 110N comprises the corresponding filter unit 104A, 104B, and 104N. Each secondary portion 112A, 112B, and 112N also comprises a corresponding portion of the transmission line system 105 and/or the one or more antennas 106 when the transmission line system 105 and/or the one or more antennas 106 are part of the wireless communication device 100.

The illustrated transmission line system 105 may comprise a transmission line trunk line 101, wherein the transmission line trunk line 101 may comprise multiple transmission line trunk line segments 101A, 101B, and 101N, which may be sequentially coupled to one another. In some implementations, phasing lines 107A, 107B, and 107N (referred to generally and/or collectively as phasing lines(s) 107) connect the transmission line trunk lines 101 to corresponding filter units 104A, 104B, and 104N. Each phasing line 107 may be connected to the transmission line trunk line 101 in parallel with other phasing lines 107; each phasing line 107 may be connected to a connection between two unique transmission line trunk line segments 101A, 101B, and 101N.

FIG. 1B illustrates an embodiment of a remote antenna unit (RAU) 115 made according to one or more embodiments described in the present disclosure. The RAU 115 may be similar to the wireless communication device 100 but may include N downlink signal paths 110A-D, 110B-D, and 110N-D, and N uplink signal paths 110A-U, 110B-U, and 110N-U. The uplink and downlink signal paths operate as described above for the wireless communications device 100.

Further, in the RAU 115, each downlink signal path 110A-D, 110B-D, and 110N-D may include a corresponding primary portion 102A-D, 102B-D, and 102N-D coupled to a corresponding duplexer 104A', 104B', and 104N'. A primary portion of a downlink signal path may also be referred to as a primary downlink signal path. A primary portion of an uplink signal path may also be referred to as a primary uplink signal path.

Each duplexer is configured to include at least a portion of either (or both) of a downlink signal path and an uplink signal path. The portions of the downlink signal path and the uplink signal path are the primary portions of the downlink signal path in the uplink signal path discussed above with respect to FIG. 1A. The portions (if any) of the downlink signal path and the uplink signal path that are included in each duplexer are referred to herein as the "secondary portions" of the downlink signal path and the uplink signal path. A secondary portion 112A-D, 112B-D, and 112N-D of a downlink signal path may also be referred to as a secondary downlink signal path. A secondary portion 112A-U, 112B-U, and 112N-U of an uplink signal path may also be referred to as a secondary uplink signal path.

As with the wireless communications device 100, each of the one or more antennas 106 and the transmission line system 105 may or may not be part of the RAU 115. Thus, the secondary portion 112A, 112B, 112N may also be located in a corresponding portion of the transmission line system 105 and/or the one or more antennas 106 depending upon whether the transmission line system 105 and/or the one or more antennas 106 are part of the RAU 115.

Figure 2:
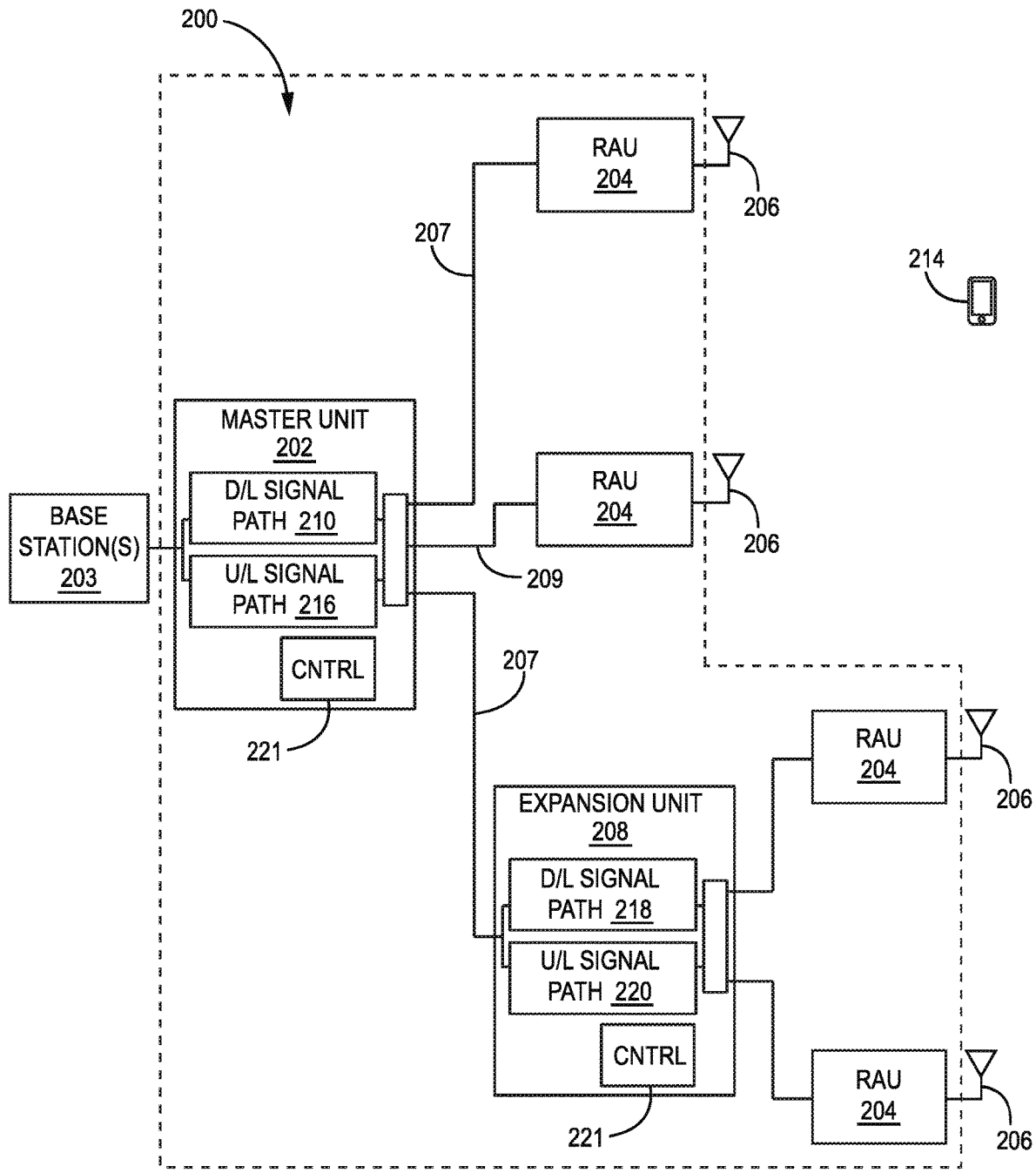
FIG. 2 illustrates a block diagram of one embodiment of a distributed antenna system implemented according to an aspect of the present disclosure.

FIG. 2 illustrates a block diagram of one embodiment of a distributed antenna system (DAS) 200 implemented according to embodiments described within the present disclosure. The DAS 200 may include one or more master units 202 that are communicatively coupled to one or more RAUs 204 via one or more cables 207, such as optical or copper cables. Each RAU 204 may be communicatively coupled directly to one or more of the master units 202 or indirectly via one or more other RAUs 204 and/or via one or more expansion (or other intermediaries) units 208. Each RAU 204 is configured to be implemented using one of the embodiments described below.

Further, each RAU 204 is configured to be coupled to one or more antennas 206. However, in an alternative embodiment, an RAU 204 may include one or more antennas.

The DAS 200 may be coupled to one or more base stations 203 and may be configured to improve the wireless coverage provided by the base station 203. The capacity of each base station 203 may be dedicated to the DAS 200 or can be shared among the DAS 200 and the base station antenna system that is co-located with the base station 203 and/or one or more other repeater systems.

In the embodiment shown in FIG. 2, the capacity of one or more base stations 203 is dedicated to the DAS 200 and is co-located with the DAS 200. The base stations 203 may be coupled to the DAS 200. It is to be understood, however, that other embodiments may be implemented in other ways. For example, the capacity of one or more base stations 203 may be shared with the DAS 200 and a base station antenna system co-located with the base station 203 (such as using a donor antenna). The base station 203 may include one or more base stations that are used to provide commercial cellular wireless service and/or one or more base stations that are used to provide public and/or private safety wireless services (for example, wireless communications used by emergency services organizations (such as police, fire, and emergency medical services) to prevent or respond to incidents that harm or endanger persons or property).

The base stations 203 may be coupled to the master units 202 using a network of attenuators, combiners, splitters, amplifiers, filters, cross-connects, etc., (sometimes referred to collectively as a "point-of-interface" or "POI"). This network may be included in the master units 202 and/or may be separate from the master units 202. This is done so that, in the downlink, the desired set of RF channels output by the base stations 203 can be extracted, combined, and routed to the appropriate master units 202, and so that, in the upstream, the desired set of carriers output by the master units 202 may be extracted, combined, and routed to the appropriate interface of each base station 203. It is to be understood, however, that this is one example and that other embodiments can be implemented in other ways.

In general, each master unit 202 comprises a downlink signal path 210 that is configured to receive one or more downlink signals from one or more base stations 203. Each base station downlink signal includes one or more radio frequency channels used for communicating in the downlink direction with user equipment 214 over the relevant wireless air interface. Typically, each base station downlink signal is received as an analog radio frequency signal, though in some embodiments one or more of the base station signals are received in a digital form (for example, in a digital baseband form complying with the Common Public Radio Interface ("CPRI") protocol, Open Radio Equipment Interface ("ORI") protocol, the Open Base Station Standard Initiative ("OBSAI") protocol, or other protocol). The downlink signal path 210 in each master unit 202 may also be configured to generate one or more downlink transport signals derived from one or more base station downlink signals and to transmit one or more downlink transport signals to one or more of the RAUs 204.

Each RAU 204 may be configured to receive the downlink transport signals transmitted from one or more master units 202 and to use the received downlink transport signals to generate one or more downlink radio frequency signals that are radiated from one or more antennas associated with that RAU 204 for reception by user equipment 214. In this way, the DAS 200 increases the coverage area for the downlink capacity provided by the base stations 203.

Also, each RAU 204 may be configured to receive one or more uplink radio signals transmitted from the user equipment 214. These signals are analog radio frequency signals. Each RAU 204 may also be configured to generate one or more uplink transport signals derived from the one or more remote uplink radio frequency signals and to transmit one or more uplink transport signals to one or more of the master units 202.

Each master unit 202 comprises an uplink signal path 216 that is configured to receive the respective uplink transport signals transmitted to it from one or more RAUs 204 and to use the received uplink transport signals to generate one or more base station uplink radio frequency signals that are provided to the one or more base stations 203 associated with that master unit 202. Typically, this involves, among other things, combining or summing uplink signals received for multiple RAUs 204 in order to produce the base station signal provided to each base station 203. In this way, the DAS 200 may increase the coverage area for the uplink capacity provided by the base station 203.

Each expansion unit 208 may include a downlink signal path 218 that is configured to receive the downlink transport signals transmitted to it from the master unit 202 (or other expansion unit 208) and transmits the downlink transport signals to one or more RAUs 204 or other downstream expansion units 208. Each expansion unit 208 also may include an uplink signal path 220 that may be configured to receive the respective uplink transport signals transmitted to it from the one or more RAUs 204 or other downstream expansion units 208, combine or sum the received uplink transport signals, and transmit the combined uplink transport signals upstream to the master unit 202 or other expansion unit 208. In other embodiments, one or more RAUs 204 may be coupled to one or more master units 202 via one or more other RAUs 204 (for example, where the RAUs 204 are coupled together in a daisy chain or ring topology).

The downlink signal paths 210 and 218 and uplink signal paths 216 and 220 in each master unit 202 and expansion unit 208, respectively, may be implemented using appropriate circuitry. Thus, the downlink signal paths 210 and 218 may also be referred to as "downlink circuitry" or "downlink DAS circuitry" 210 and 218, and the uplink signal paths 216 and 220 may also be referred to as "uplink circuitry" or "uplink DAS circuitry" 216 and 220. The downlink signal paths 210 and 218 and the uplink signal paths 216 and 220 may include one or appropriate connectors, attenuators, combiners, splitters, amplifiers, filters, duplexers, transmit/receive switches, analog-to-digital converters, digital-to-analog converters, electrical-to-optical converters, optical-to-electrical converters, mixers, field-programmable gate arrays (FPGAs), microprocessors, transceivers, framers, etc., to implement the features described above. Also, the respective downlink and uplink signal paths in each of the master units 202 and expansion units 208 may share common circuitry and/or components.

The DAS 200 may use digital transport, analog transport, or combinations of digital and analog transport for generating and communicating the transport signals between the master units 202, the RAUs 204, and any expansion units 208. Each master unit 202 and expansion unit 208 in the DAS 200 may also include a respective controller (CNTRL) 212 (or controller circuitry). The controller 212 may be implemented using one or more programmable processors that execute software that is configured to implement the various control functions.

Returning to FIGS. 1A and 1B, implementations of a transmission line system 105 according to embodiments described in the present disclosure are presented below in FIGS. 3-12B. The transmission line system 105 may be formed using phasing lines that are precisely located within a groove formed in a conductive body. In particular, the phasing lines extend through the groove, where the space between the surfaces of the groove and phasing line is a dielectric separating the phasing line and the conductive body.

Figure 3:
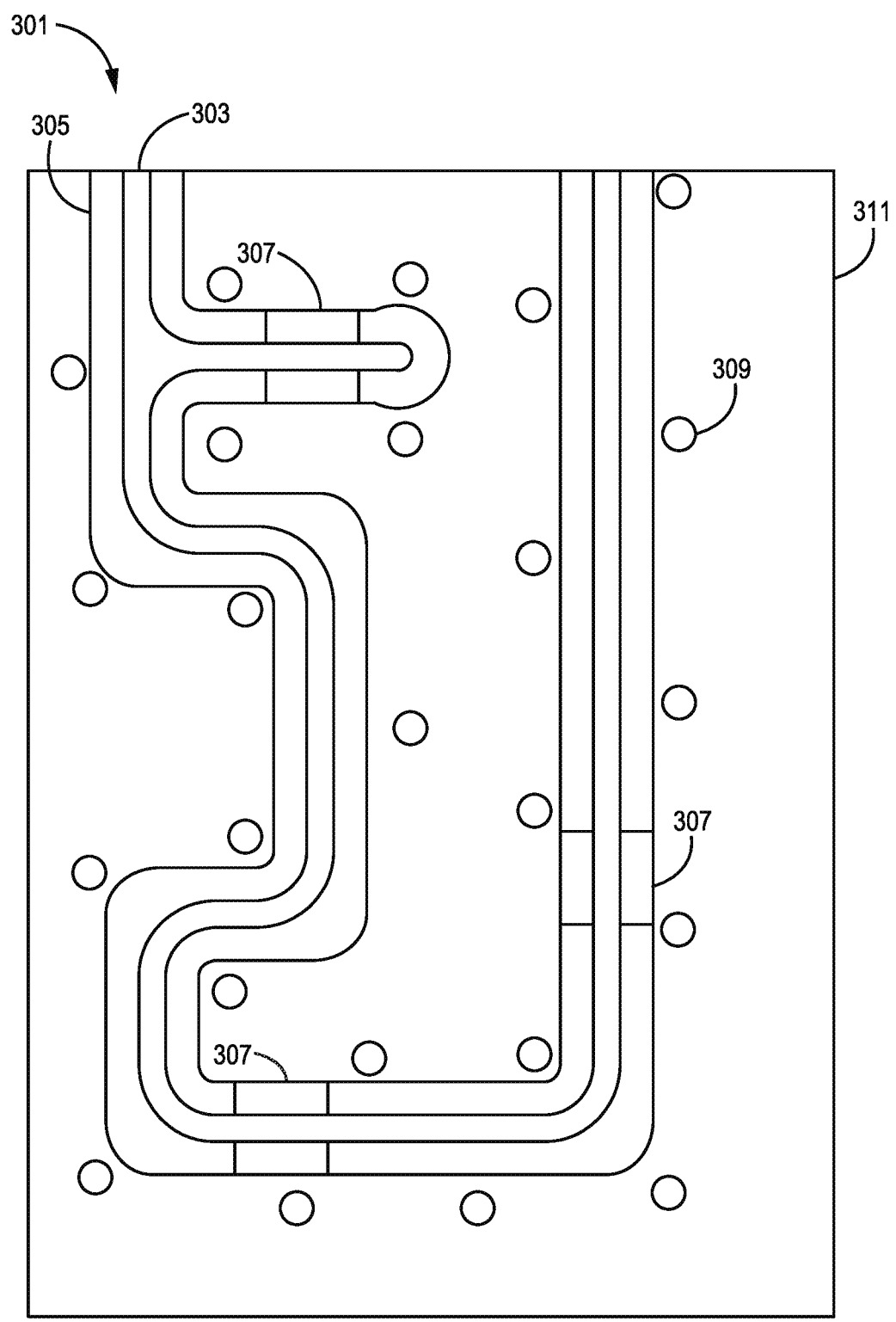
FIG. 3 is a diagram illustrating an exemplary embodiment of a phasing line located within a groove according to an aspect of the present disclosure.

FIG. 3 illustrates a portion 301 of a transmission line system (such as transmission line system 105) that implements phasing lines 303. As shown, a phasing line 303 may extend through a groove 305 in a conductive body 311 at a precise location in the groove 305. As described herein, the conductive body 311 may refer to a solid material that conducts electricity, such as a metallic body and the like. As used herein, the phasing line 303 may be precisely located within a groove 305 where the phasing line is at a precise distance from the sides of the groove 305 to match impedances and reduce insertion loss of signals transmitted through the phasing line 303. As the phasing line 303 extends through the groove 305 without contacting the surfaces of the groove 305, the cavity surrounding the phasing line 303 may act as an insulator between the phasing line 303 and the conductive body 311. Accordingly, the phasing line 303, the conductive body 311, and the cavity formed by the groove 305 surrounding the phasing line 303 function together to facilitate the transmission of signals through the phasing line 303.

Additionally, while not shown, a cover may be placed over the surface of the conductive body 311 having the groove 305 formed therein. To secure the cover to the body, screws or other fastening mechanisms may extend through the groove 305 to engage fastening locations 309. The fastening mechanism may be a screw, rivet, or other means of securely fastening a cover to the conductive body 311. Further, the cover may be conductive in a similar manner to the conductive body 311. The surface of the cover facing the groove 305 may be at a precise distance from the phasing line 303. Accordingly, the cover and the surfaces of the groove 305 form the interior surfaces of an outer conductor separated by an insulator from the inner conductor that is the phasing line 303.

In some embodiments, a phasing line 303 may have a complex shape to properly match the impedances for the various devices connected to the phasing line 303. As discussed above, to provide the desired impedance matching, the phasing line 303 may be precisely and fixedly positioned at a specific location in relation to the sides of the groove 305. To aid in precisely and fixedly positioning the phasing line 303, the phasing line 303 may be placed within holders 307. As described herein, a holder 307 may generally refer to an object that can be placed within the groove 303 to secure the position of the phasing line 303 in relation to the surfaces of the groove 305. For example, the holder 307 may be an object having a channel formed therein in which the phasing line 307 sits, where the surfaces of the channel are at a precise distance from the surfaces of the groove 305.

In some embodiments, a holder 307 may be formed from an insulative material that has a limited effect on signals transmitted through the phasing line 303. Examples of insulative material may include plastic materials such as Rexolit, Teflon, and the like. Using plastic materials allows flexibility in placing the holder 307 into the groove and locating the phasing line 303 within the holder 307. Teflon, or other materials, may also have desired RF properties, such that a holder 307 has a limited effect on signals transmitted through the phasing line 303.

In certain embodiments, when the phasing line 303 and the holders 307 are at the desired location within the groove 305, the holders 307 may be secured to the surfaces of the groove 305 to prevent the holders 307 from moving within the groove 305. Typically, the holders 307 are secured to the surfaces of the groove 305 using adhesives. However, some insulative materials, such as Teflon, do not readily bond to adhesives. As such, when a holder 307 is made from Teflon or other similar materials, the holders 307 may move after the installation of the phasing lines 303 within the groove 305 such that the distance between the phasing line 303 and the surfaces of the groove 305 may change, negatively affecting the impedance matching of the phasing lines 303.

As described in embodiments presented in this disclosure, to secure the location of the holders 307 within the groove 305, the holders 307 may have features that allow some of the surfaces of the holder 307 to be pressed against the surfaces of the groove 305 such that the friction between the surfaces of the holder 307 and the surfaces of the groove 305, in contact with the surfaces of the holder 307, secure the position of the holder 307 within the groove 305. Thus, the position of the holder 307 will not change after installation, and the phasing lines 303 will have the desired and designed impedance matching.

Figure 4A:
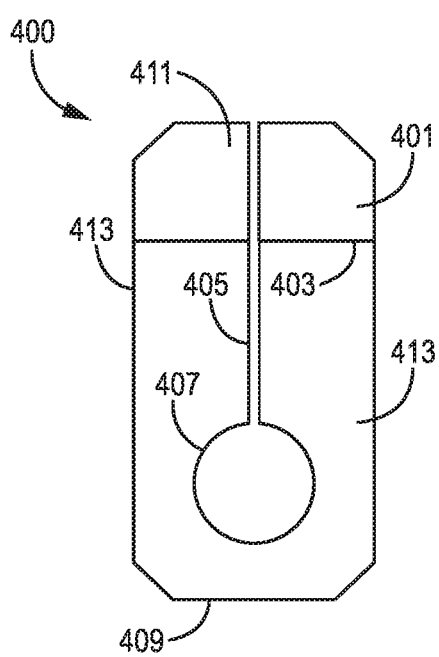
FIGS. 4A-4C are diagrams illustrating one embodiment of a phasing line holder according to an aspect of the present disclosure.
Figure 4B:
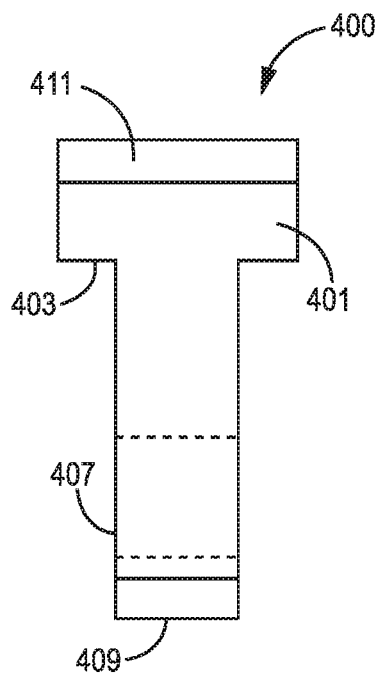
Figure 4C:
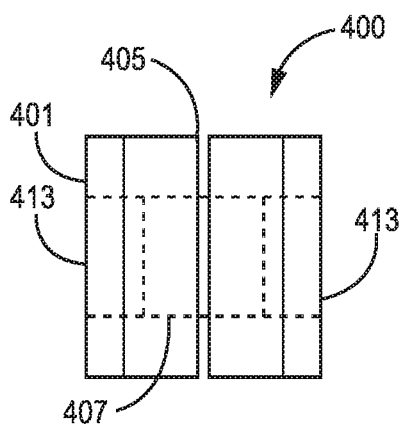

FIGS. 4A-4C are diagrams illustrating multiple views of an embodiment of a holder 400 having features that allow for surfaces of the holder 400 to be pressed against surfaces of a groove, such as the groove 305 described above in relation to FIG. 3. In particular, FIG. 4A is a diagram illustrating a front view of the holder 400, where a front view is a view that runs longitudinally along a prospective phasing line or containing groove toward the holder 400. FIG. 4B is a diagram illustrating a side view of the holder 400, where a side view is a view of a surface of the holder 400 that faces a side surface of a containing groove. FIG. 4C is a diagram illustrating a top view of the holder 400, where a top view is a view from above the groove, looking into the groove containing the holder 400.

As illustrated in FIG. 4A, the holder 400 may have a channel 407 that extends longitudinally through the holder 400. The channel 407 may allow a phasing line to pass through the holder 400. Accordingly, to secure the phasing line, the channel 407 may have a diameter that is substantially equal to the diameter of a phasing line secured within the holder 400. As shown, channel 407 may be a specific distance from a side surface 413 and a bottom surface 409 of the holder 400. The bottom surface 409 is the surface of the holder 400 that, when placed inside a groove, contacts the bottom surface of the groove, and a side surface 413 is the surface of the holder 400 that contacts the side surface of the groove.

In certain embodiments, the holder 400 may also include a slot 405. As described herein, the slot 405 may facilitate the insertion of a phasing line into the holder 400. For example, before placing the phasing line within a groove, the holder 400 may be placed on the phasing line by sliding the phasing line through the slot 405 until it is within the channel 407. When the one or more holders are located on the phasing line, the phasing line and attached holders may be placed within the groove.

As illustrated in FIG. 4B, the holder 400 may also include a top portion 401, where the top portion 401 has a length along the longitudinal direction of the phasing line that is longer than other portions of the holder 400. As shown, the top portion 401 may have a top surface 411 and a bottom surface 403. The top portion 401 may be longer along the longitudinal direction of the phasing line than the other portions of the holder 400 such that the top surface 411 may have an increased surface area. FIG. 4C provides an illustration showing the top surface 411 of the holder 400. As shown, the top surface 411 is longer than the longitudinal direction than the bottom surface 409, shown in FIG. 4B. The top surface 411 is longer to allow a portion of an object to be slid into the top portion 401 of the slot 405 to push the side surfaces 413 against surfaces of a groove after the phasing line has been located within the channel 407 and the phasing line/holders combination has been slid into the groove. If the top portion 401 is not sufficiently long, when a portion of an object is slid into the slot 405 at a location along the top surface 411, there is a chance that the object may push the holder 400 longitudinally along the containing groove or cause the holder 400 to rotate longitudinally around the phasing line, which may potentially affect the position and impedance matching of the phasing line.

FIGS. 5A-5C are diagrams illustrating multiple views of a further embodiment of a holder 500 having features that allow for surfaces of the holder 500 to be pressed against surfaces of a groove, such as the groove 305 described above in relation to FIG. 3. Similar to FIGS. 4A-4C, FIG. 5A is a diagram illustrating a front view of the holder 500, FIG. 5B is a diagram illustrating a side view of the holder 500, FIG. 5C is a diagram illustrating a top view of the holder 500.

As illustrated in FIG. 5A, the holder 500 may have a channel 507 that extends longitudinally through the holder 500 in a substantially similar manner as described above with regards to the channel 407 of FIG. 4A. Accordingly, the channel 507 may be a specific distance from a side surface 513 and a bottom surface 509 of the holder 500. Also, the holder 500 may include a slot 505. As described herein, the slot 505 may facilitate the insertion of a phasing line into the holder 500. For example, before placing the phasing line within a groove, the holder 500 may be placed on the phasing line by sliding the phasing line through the slot 505 until it is within the channel 507. When the one or more holders are located on the phasing line, the phasing line and attached holders may be placed within the groove.

In contrast to FIGS. 4A-4C and as shown in FIG. 5B, the length of the holder 500 along the longitudinal direction of the phasing line may be uniform along the height of the holder 500. Thus, a portion of an object may be slid into the slot 505 on a top surface 511 (shown in FIG. 5C) such that the side surfaces 513 of the holder 500 are pushed against surfaces of a groove after the phasing line has been located within the channel 507 and the phasing line/holders combination has been slid into the groove. Further, the holder 500 has sufficient length along the length of the groove so the holder does not move when a portion of the object is slid into the slot 505 at a location along the top surface 511.

Figure 6A:
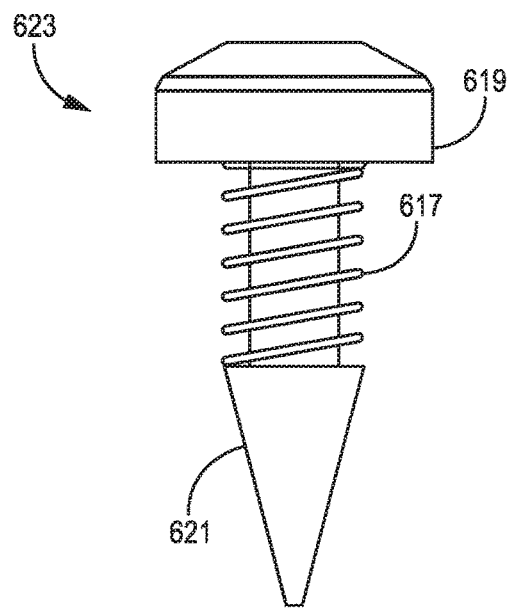
FIGS. 6A-6C are diagrams illustrating the securing of a phasing line within a phasing line holder according to an aspect of the present disclosure.
Figure 6B:
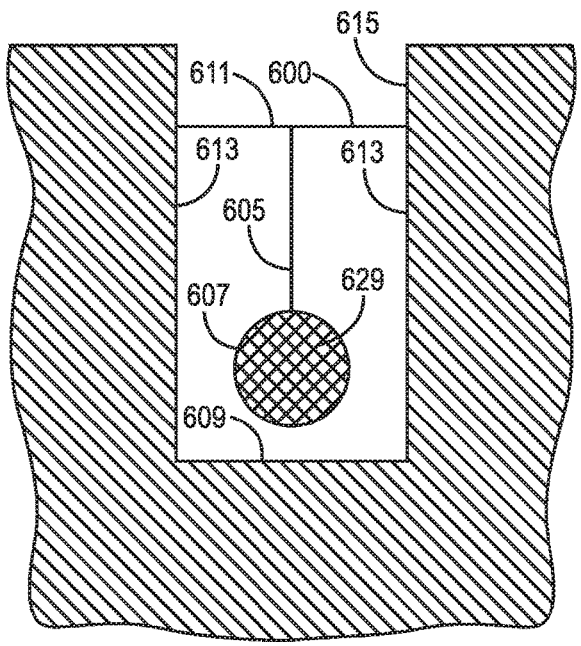
Figure 6C:
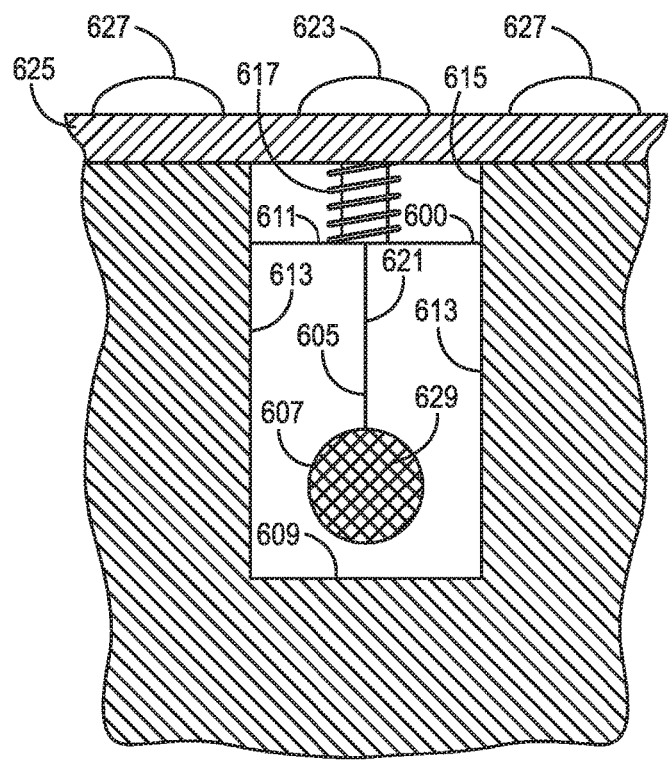

FIGS. 6A-6C, illustrate an exemplary insertion object 623 and the use of the insertion object 623 to secure a holder 600 for a phasing line 629 within a groove 615, where holder 400 of FIGS. 4A-4C and holder 500 of FIGS. 5A-5C are different exemplary embodiments of the holder 600. Accordingly, the holder 600 may include a slot 605 (similar to slots 405 and 505), a channel 607 (similar to channels 407 and 507), side surfaces 613 (similar to side surfaces 413 and 513), a top surface 611 (similar to top surfaces 411 and 511), and a bottom surface 609 (similar to bottom surfaces 409 and 509).

FIG. 6A illustrates an exemplary embodiment for an insertion object 623, where a portion of the insertion object 623 may be inserted into a holder 600. As shown, the insertion object 623 may have a specialized tip 621. In some embodiments, the specialized tip 621 may be a conically shaped tip. While a conically shaped tip is shown for the specialized tip 621, the insertion object 623 may be of other shapes that can engage the slot 605 of the holder 600. For example, the specialized tip 621 may be wedge-shaped or be formed from another shape capable of being slid into the slot 605 such that the side surfaces 613 are pushed against the surfaces of a groove 615.

In additional embodiments, the insertion object 623 may include a forcing mechanism that can force and secure the specialized tip 621 within the slot 605. For example, the forcing mechanism may be a shaft having screw threads 617 formed thereon, where the screw threads 617 engage a supportive structure and drive the specialized tip 621 into the slot 605 and maintain the specialized tip 621 within the slot 605 after insertion. Additionally, the forcing mechanism may include a screw head 619 to allow a user to turn the insertion object 623 when driving the specialized tip into the slot 605. The screw head 619 may be engaged through any of the types of screw heads known to one having skill in the art (i.e., Phillips, square, slot, Torx, hexagonal, etc.). Alternatively, while a screw-like forcing mechanism is shown for the insertion object 623, the forcing mechanism may include any combination of structures capable of forcing the specialized tip 621 into the slot 605 and maintaining the specialized tip within the slot 605 after installation of the holder 600 within the groove.

FIG. 6B illustrates an exemplary embodiment for the installation of a holder 600 and phasing line 629 within a groove 615 before the insertion of the insertion object 623 into the slot 605. As illustrated, the phasing line 629 may be placed within the channel 607 of the groove 615. When the phasing line 629 is within the channel 607, the combination of the phasing line 629 and the holder 600 may be placed within the groove 615.

FIG. 6C illustrates the use of an insertion object 623 to secure the position of the holder 600 within the groove 615. As illustrated, when a holder 600 and phasing line 629 are within a groove 615, a cover 625 may be placed over the groove 615. When the cover is placed over the groove 615, the cover 625 may be secured to the conductive body having the groove 615 formed therein using attachments 627 (such as screws, welds, rivets, or other methods of securing the cover 625 to the conductive body).

In some embodiments, the cover 625 may have a hole formed therein that corresponds with the position of the holder 600 within the underlying groove 615. Accordingly, the insertion object 623 may be inserted through the hole, where a portion of the insertion object 623 is driven into the slot 605. For example, the specialized tip 621 may be inserted through the hole until the threads 617 engage with the cover 625. When the threads 617 engage with the cover 625, a user may use a screwdriver to engage with the screw head of the object 619 to force the threads to bite into the cover 625 and drive the specialized tip 621 into the slot 605. As the specialized tip 621 is driven into the slot 605, the side surfaces 613 of the holder 600 are forced against the side surfaces of the groove 615 such that the friction between the side surfaces 613 of the holder 600 and the side surfaces of the groove 615 are substantial enough to prevent the holder 600 from moving within the groove 615. While the insertion object 623 has been illustrated as being a screw with a specialized tip 621, other structures that can be similarly inserted into the groove 615 to force and secure the side surfaces 613 against the surfaces of the groove 615 may also be used (e.g., conical or triangular wedges). Also, the insertion object 623 may be separate from or part of the cover 625. Accordingly, the insertion object 623 may be used to secure the holder 600 within a groove 615.

FIGS. 7A and 7B illustrate a further embodiment of a holder 700 that includes a securing mechanism 700b that secures a holder base 700a within a specialized groove 737. In particular, FIG. 7A illustrates a holder base 700a for holding a phasing line. As illustrated, the holder base 700a may include a channel 715 for holding a phasing line within the holder base 700a. Further, the channel 715 may be a precise distance from a bottom surface 731 and a side surface 725 of the holder base 700a. Accordingly, when a phasing line is located within a channel 715 and the holder base 700a and phasing line are placed within a groove, the phasing line may be located at a precise distance from the surfaces of the groove.

In certain embodiments, the holder base 700a may include features to facilitate the placement of the holder base 700a within a groove. For example, the holder base 700a may include a bottom surface 731, a tapered side surface 719, a side surface 725, a bottom chamfer 729, and a pivot section 727. As used herein, the bottom surface 731 may refer to the surfaces of the holder base 700a that are designed to contact the bottom surface of a groove. In contrast to the holder base 700a described above with regards to FIGS. 4A-6C, the bottom surface 731 may include two parallel portions that are interrupted by a pivot section 727. As used herein, the pivot section 727 may refer to a section of the holder base 700a that is thinned to allow the holder base 700a to bend around the pivot section 727.

In further embodiments, the holder base 700a may include chamfered edges 729, that facilitate the sliding of the holder through a groove having protrusions when portions of the holder base 700a are bent around the pivot section 727. Additionally, the chamfered edges 729 are connected to side surfaces 725 that, in turn, are connected to tapered side surfaces 719. As illustrated, the width of the holder base 700a gradually gets wider along the length of the tapered side surfaces 719 as the distance from the bottom surface 731 increases. Accordingly, the width of the holder base 700a associated with the side surface 725 is less than the gradually increasing widths of the holder base 700a associated with the tapered side surfaces 719. In particular, the narrower width of the holder base 700a associated with the side surface 725 and the gradually increasing width associated with the tapered side surface 719 facilitate the insertion of the holder base 700a around protrusions in the surface of the groove.

In additional embodiments, the holder base 700a may include features to facilitate the securing of the holder base 700a within a groove. For example, the holder base 700a may include a securing mechanism portion 705, a top surface 701, and a side securing surface 713. As used herein, the securing mechanism portion 705 may receive a portion of a securing mechanism 700b that secures the position of the securing mechanism 700b in relation to the holder base 700a. As shown, the securing mechanism portion 705 may be a substantially circular recessed area in the top surface 701 of the holder base 700a interrupted by a slot (where the slot facilitates the insertion of a phasing line into the channel 715). The top surface 701 may engage with the securing mechanism 700b such that when the securing mechanism 700b applies a force against the top surface 701, the side securing surfaces 713 may be pushed against and apply a force against the side surfaces of a groove. Additionally, when force is applied to the top surface 701 by the securing mechanism 700b, the bottom surface 731 of the holder base 700a may also apply a force against the surface of a groove. Thus, when the side securing surfaces 713 and the bottom surfaces 731 exert a force on the surfaces of a groove to secure the position of the holder base 700a within the groove.

FIG. 7B illustrates an exemplary embodiment of a securing mechanism 700b. In certain embodiments, as mentioned above, the securing mechanism 700b may function to secure the position of the holder base 700a within a groove. As illustrated, the securing mechanism 700b may include a bottom surface 717 on a holder insertion portion 711. As used herein, the holder insertion portion 711 may refer to a portion of the securing mechanism 700b that secures the position of the securing mechanism 700b in relation to the holder base 700a. In some embodiments, the bottom surface 717 of the holder insertion portion 711 may abut against the top of a phasing line to further secure the position of the phasing line within the holder base 700a.

In some embodiments, the securing mechanism 700b may include a pair of unlocking edges 707, and a pair of locking edges 721 that function to lock/unlock the holder base 700a in position within the groove as controlled by the rotation head 703. For example, the pair of unlocking edges 707 may be located on opposite sides of the securing mechanism 700b. Additionally, the pair of unlocking edges 707 may be oriented such that they are parallel to one another. Also, the distance between each unlocking edge 707 in the pair of unlocking edges 707 may be less than the distance between protrusions in the groove, which contains the holder base 700a. Similarly, the pair of locking edges 721 may be located on opposite sides of the securing mechanism 700b. The pair of locking edges 721 may be alternatingly adjacent to the unlocking edges 707 such that the alternating locking edges 721 and unlocking edges 707 form an outer edge of the securing mechanism 700b. In contrast to the unlocking edges 707, locking edges 721 may not be parallel to one another and may be oriented to form the circumference of a cylinder, (if the locking edges were to extend around the outer edge of the securing mechanism 700b, uninterrupted by the unlocking edges 707). Additionally, the diameter of the cylinder formed by the locking edges 721 may be larger than the distance between the protrusions of the groove. In some implementations, the diameter of the cylinder may be substantially large to cause the locking edges 721 to engage with sides of the groove. In some embodiments, the combination of locking edges 721 and unlocking edges 707 may form a cylinder having two parallel truncated portions, where the truncated portions are the unlocking edges 707 and the cylindrical portions are the locking edges 721.

In certain embodiments, the rotation head 703 may allow an individual to rotate the securing mechanism 700b. For example, the rotation head 703 may be a portion of the securing mechanism 700b that extends from a top surface 709 of the securing mechanism 700b, allowing an individual to control the rotation securing mechanism 700b. In some implementations, the rotation head 703 may have a slot that extends through the rotation head 703 to facilitate the rotation of the securing mechanism 700b. Other means of facilitating the rotation of the screen mechanism 700b may also be implemented for the rotation head 703. For example, the rotation head 703 may be a slot (or other patterns that can be used to control the rotation of the securing mechanism 700b) formed in the top surface 709.

In some embodiments, the top surface 709 of the securing mechanism 700b may be designed to engage surfaces of the groove containing the holder base 700a. For example, the top surface 709 may be sloped away from the outer circumference of the securing mechanism 700b such that the distance between the top surface 709 and the bottom surface 723 increases as the distance from the outer circumference of the securing mechanism 700b increases. Accordingly, as the securing mechanism 700b is rotated and the locking edges 721 engage the side surfaces of a containing groove, the top surface 709 may apply pressure to the bottom surfaces of protrusions in the groove. By applying pressure to the bottom surfaces of the protrusions, the bottom surface 723 of the securing mechanism 700b may also apply pressure to the top surface 701 of the holder base 700a. The applied pressure to the top surface 701 may cause the side securing surfaces 713 and the bottom surface 731 to apply a force against the surfaces of the groove that is sufficient enough to secure the position of the holder base 700a within a containing groove.

FIG. 8A illustrates a holder base 700a placed within a groove 737 having a pair of protrusions 733, where the securing mechanism 700b is in a locked position. As discussed above, the securing mechanism 700b is in a locked position, when the securing mechanism 700b causes the side securing surfaces 713 and/or the bottom surface 731 to apply a force against the side surfaces of the groove 737 and the bottom surface 731 of the groove 737. As used herein, the bottom surface of the groove 737 may refer to the surface of the groove 737 that is opposite to the opening of the groove 737 through which the holder base 700a is inserted. The bottom surface of the groove 737 may also be referred to as the floor of the groove 737.

In certain embodiments, the groove 737 may be designed for securing a specific type of holder base 700a within the groove 737. For example, to secure the holder base 700a within the groove 737, the groove 737 may include a pair of protrusions 733. The protrusions 733 may have a bottom surface 735 that is substantially equal to the height of the holder base 700a plus the height of the securing mechanism 700b at the outer edge of the locking edges 721. In some implementations, the bottom surface 735 may be perpendicular or sloped in relation to the surface of the groove 737. As mentioned above, the distance between the two protrusions 733 is greater than the distance between the pair of unlocking edges 707 of the securing mechanism 700b, but less than the diameter of the securing mechanism 700b between the two locking edges 721.

In some embodiments, when the securing mechanism 700b is turned such that the unlocking edges 707 of the securing mechanism 700b are perpendicularly oriented with respect to the side surfaces of the groove 737, the top surface 709 of the securing mechanism 700b may exert a force against the bottom surface 735 of the protrusions 733. Due to the force exerted by the top surface 709 on the bottom surface 735 of the protrusions 733, the bottom surface 723 of the securing mechanism 700b may exert a corresponding force on the top surface 701 of the holder base 700a. The force exerted on the top surface 701 of the holder base 700a may push the side securing surfaces 713 of the holder base 700a and the bottom surface 731 into corresponding surfaces of the groove 737. Due to the friction between the surfaces, the holder base 700a in contact with surfaces of the groove 737, the position of the holder base 700a may be fixed in relation to the groove 737. Also, in some implementations, the bottom surface 717 of the securing mechanism 700b may also exert a force on the phasing line 739 to further secure the phasing line 739 within the channel 715. Accordingly, the holder base 700a provides another exemplary embodiment of a type of holder base 700a capable of securing a phasing line 739 within a groove 737.

Figure 8B:
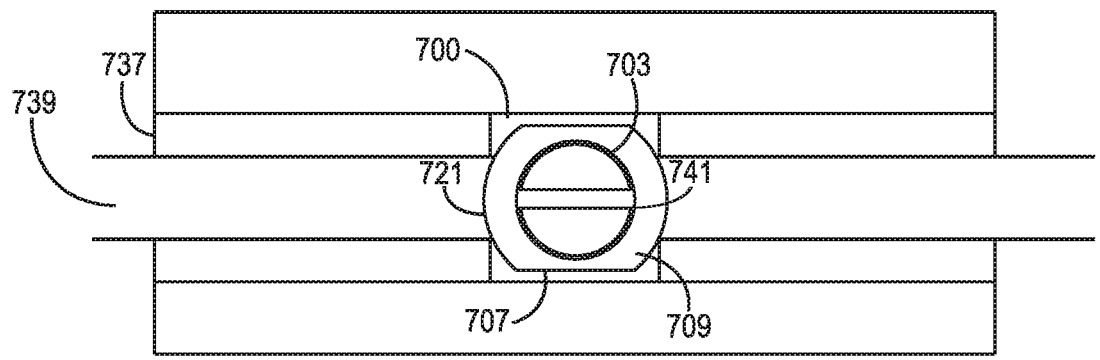
Figure 8C:
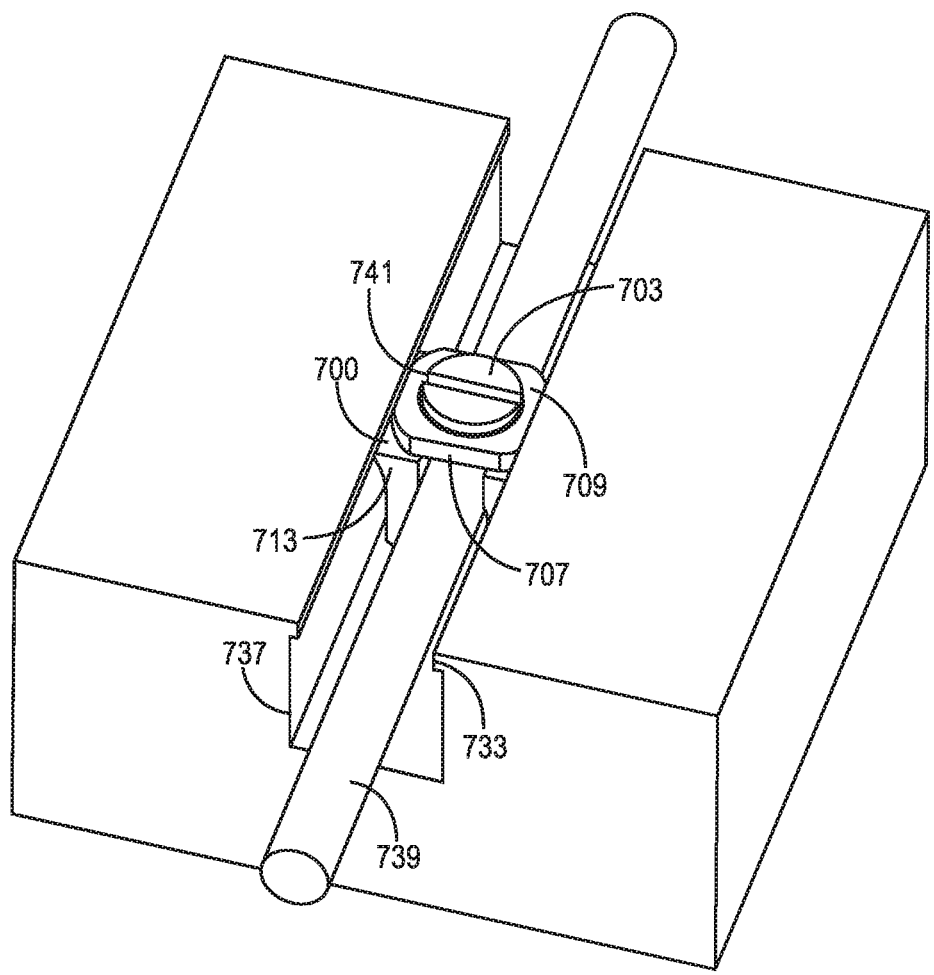

FIGS. 8B-8C illustrate exemplary embodiments for steps in placing and securing a holder 700 and phasing line 739 within a groove 737. As illustrated in FIG. 8B, a holder base 700a may be placed within the groove 737. As discussed above, the pivot section 727 of the holder base 700a may allow the holder base 700a to bend such that the side securing surfaces 713 may fit around the protrusions 733. When the holder base 700a is located within the groove 737, a phasing line 739 may be inserted into the channel 715 of the holder base 700a. When the phasing line 739 is inserted into the channel 715 of the holder base 700a, the securing mechanism 700b may be inserted into the securing mechanism portion 705 of the holder base 700a such that the unlocking edges 707 are parallel to the side surfaces of the groove 737.

As illustrated in FIG. 8C, the rotating mechanism 703 may be rotated to lock the position of the holder base 700a within the groove 737. For example, an individual may rotate the rotating mechanism 703 such that the top surface 709 of the securing mechanism 700b engages with the bottom surface 735 of the protrusion 733. In some embodiments, when the top surface 709 engages the bottom surface 735 of the protrusion 733, the unlocking edges 707 may be perpendicularly oriented with respect to the side surfaces of the groove 737. As described above, when the securing mechanism 700b is in the locked position, the holder base 700a exerts forces against the surfaces of the groove 737 to fix the position of the holder 700 with respect to the groove 737.

Figure 9A:
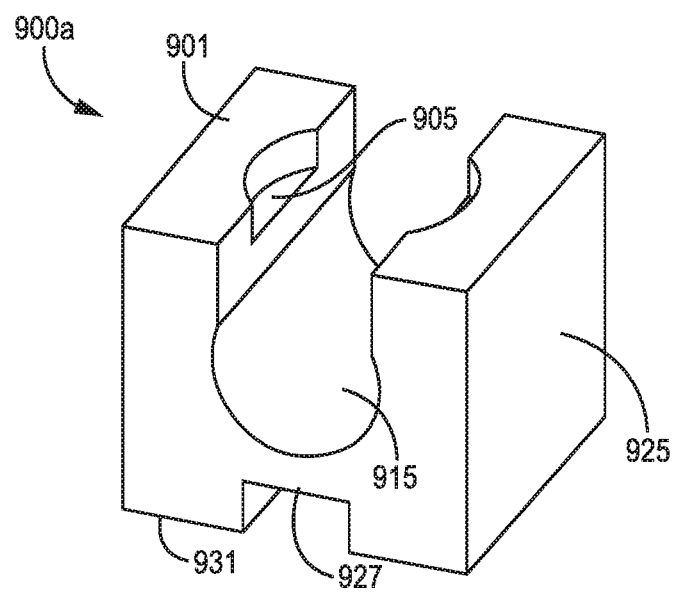
FIGS. 9A-9B are diagrams illustrating one embodiment of a phasing line holder according to an aspect of the present disclosure.
Figure 9B:
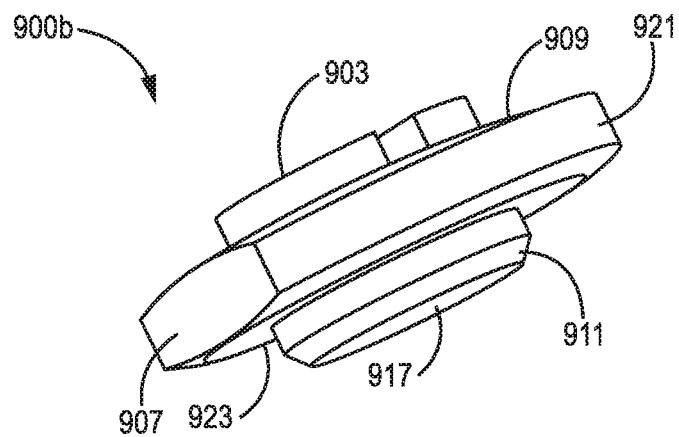

FIGS. 9A and 9B illustrate a further embodiment of a holder 900 that includes a further exemplary embodiment of a securing mechanism 900b to secure a holder base 900a within a different embodiment of a specialized groove 937. In particular, FIG. 9A illustrates a holder base 900a for holding a phasing line. As illustrated, the holder base 900a may include a channel 915, a pivot section 927, a securing mechanism portion 905, a bottom surface 931, and a top surface 901, which are similar to the channel 715, the pivot section 727, the securing mechanism portion 705, the bottom surface 731, and the top surface 701 described above in connection to holder base 700a of FIG. 7A.

In contrast to the holder base 700a, the holder base 900a may include side surfaces 925 that are substantially parallel and substantially the width of a containing groove at the opening of the groove. Accordingly, the holder base 900a may be inserted into a groove without pivoting about the pivot section 927.

FIG. 9B illustrates a securing mechanism 900b that may be used to lock the position of the holder base 900a with respect to a groove containing the holder base 900a. For example, the securing mechanism 900b may include a rotation mechanism 903, a top surface 909, unlocking edges 907, locking edges 921, a bottom surface 917, and a holder insertion portion 911 that are substantially similar to the rotation mechanism 703, a top surface 709, unlocking edges 707, locking edges 721, a bottom surface 717, and a holder insertion portion 711 described above in connection with the holder base 700a of FIG. 7B. In contrast to the securing mechanism 700b, the securing mechanism 900b may be wider than the holder base 900a. For example, the diameter of the cylinder associated with the locking edges 921 may be larger than the width of the holder base 900a, commensurately, the diameter may also be larger than the width of the groove containing the holder base 900a. Also, the distance between the parallel unlocking edges 907 may be similar to the width between the side surfaces 925 of the holder base 900a and the width of the groove containing the holder 900.

In contrast to the securing mechanism 700b, the securing mechanism 900b may include a bottom surface 923 that is designed to engage surfaces of a side groove formed in a side surface of the groove containing the holder base 900a. For example, like the top surface 909 of the securing mechanism, the bottom surface 923 may be sloped away from the outer circumference of the securing mechanism 900b such that the distance between the bottom surface 923 and a plane formed by the bottom surface 917 of the holder insertion portion 911 decreases as the distance increases from the outer circumference of the securing mechanism 900b. Accordingly, as the securing mechanism 900b is rotated such that the locking edges 921 rotate into side grooves of a containing groove, the top surface 909 may apply pressure to top groove surfaces of the side grooves, and the bottom surface 923 may apply pressure to bottom groove surfaces of the side grooves. By applying pressure to the surfaces of the side groove, the securing mechanism 900b may secure the position of the holder base 900a within a containing groove.

Figure 10A:
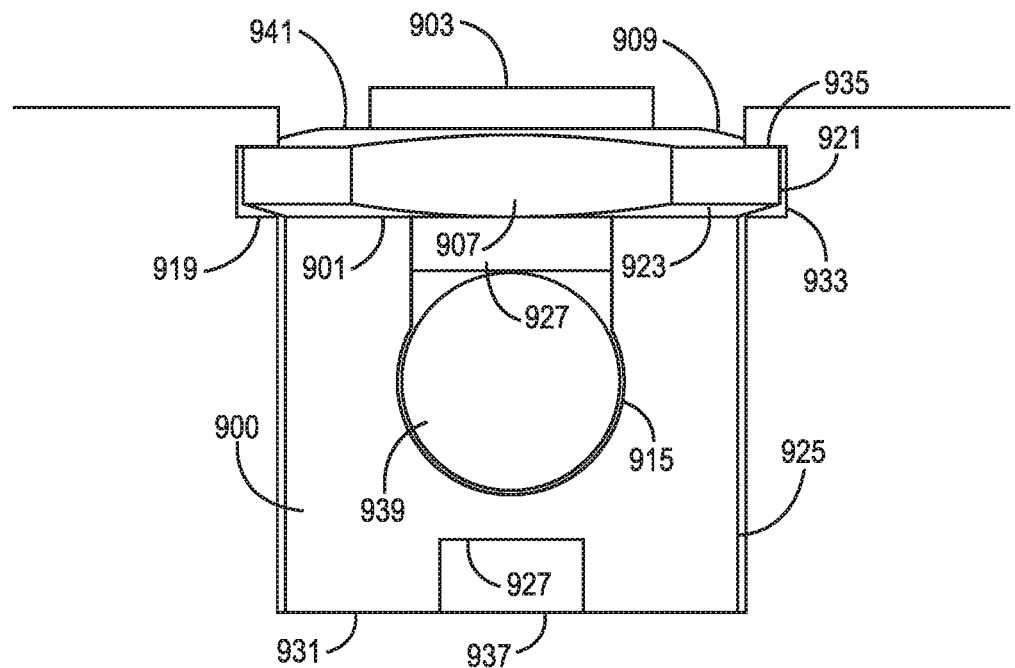
FIGS. 10A-10B are diagrams illustrating the securing of a phasing line within a phasing line holder according to an aspect of the present disclosure.
Figure 10B:
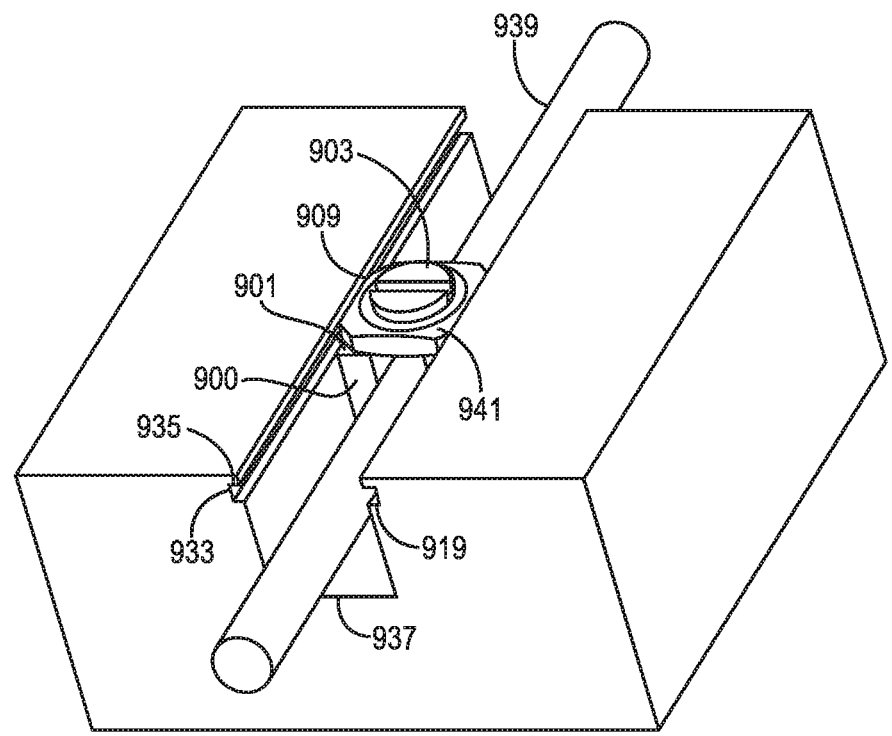

FIGS. 10A and 10B illustrate different views of a holder 900 within a groove 937, where the securing mechanism 900b is in the locked position. As illustrated, a holder base 900a may be inserted into the groove 937. As illustrated, the distance between the side surfaces of the holder base 900a is substantially similar to the distance between the side surfaces of the groove 937. As illustrated, the groove 937 may include side grooves 933 formed in the side surfaces of the groove 937. As illustrated, the side grooves 933 may include a top side groove surface 935 and a bottom side groove surface 919. As shown, the bottom side groove surface 919 may be a surface of the side groove 933 that is parallel and closest to the bottom surface of the groove 937. The top side groove surface 935 may be a surface of the side groove 933 that is parallel and farthest from the bottom surface of the groove 937. When the holder base 900a is inserted into the groove 937, the bottom side groove surface 919 may be aligned with the top surface 901 of the holder base 900a.

When the holder base 900a is placed within the groove 937, a phasing line 939 may be inserted within the channel 915. The holder base 900a may be secured within the groove 937 by inserting the securing mechanism 900b into the securing mechanism portion 905, and rotating the securing mechanism 900b into a locked position in a substantially similar manner as described above with respect to FIGS. 8B-8C. When the securing mechanism 900b is rotated into the locked position, the top surface 909 may apply pressure against the top side groove surface 935. In some implementations, when the top surface 909 applies pressure against the top side groove surface 935, the securing mechanism 900b may exert a force against the holder base 900a such that the bottom surface 931 of the holder base 900a presses against the bottom surface of the groove 937. Further, the bottom surface 923 of the securing mechanism 900b may also exert a force against the bottom side groove surface 919 of the side groove 933. Due to the forces exerted by the securing mechanism 900b and the side groove 933, the securing mechanism 900b may secure the position of the holder 900 with respect to the groove 937. As shown, the top side groove surface 935 and the bottom side groove surface 919 are perpendicular to the side surface of the groove 937. Alternatively, the top side groove surface 935 and the bottom side groove surface 919 may also be sloped in relation to the side surface of the groove 937.

Figure 11A:
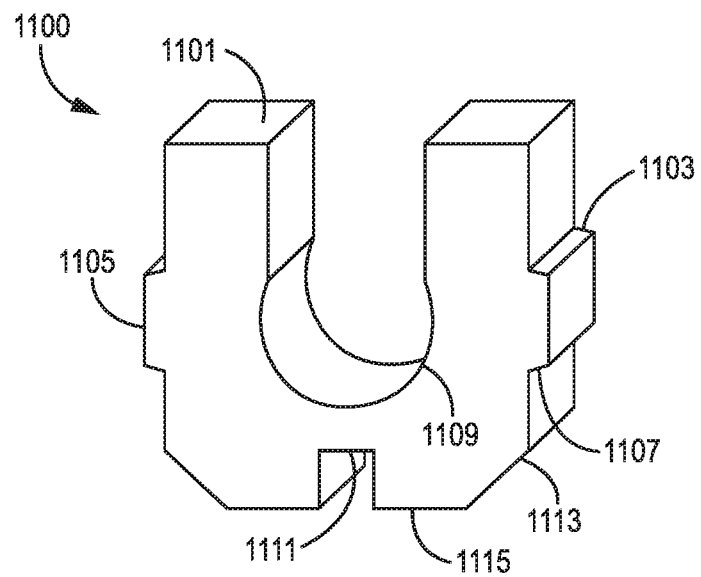
FIGS. 11A-11B are diagrams illustrating one embodiment of a combination of a phasing line holder and groove according to an aspect of the present disclosure.
Figure 11B:
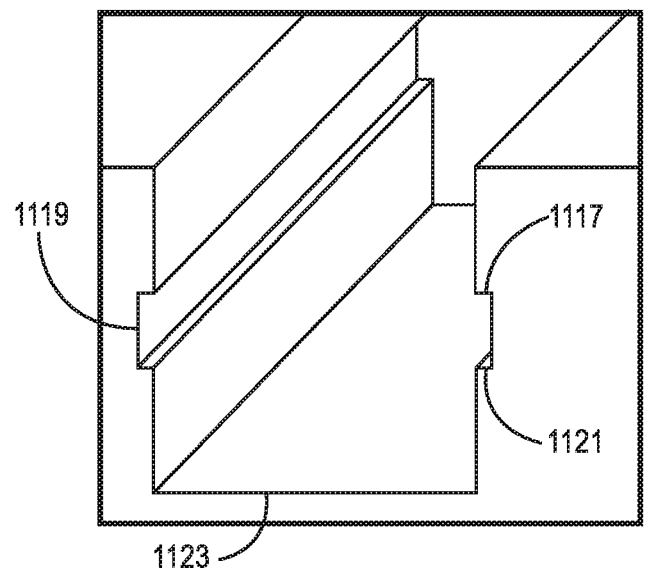

FIGS. 11A and 11B respectively illustrate a further exemplary embodiment of a holder 1100 for insertion into a groove 1123. In contrast to the other holders described above, an inserted phasing line may cause the holder 1100 to exert a force on surfaces of the groove 1123 to secure the position of the holder 1100 within the groove 1123. As illustrated, the holder 1100 may include a top surface 1101, a bottom surface 1115, a bottom chamfer 1113, and a pivot section 1111, which function similarly to the top surface 701, the bottom surface 731, the bottom chamfer 729, and the pivot section 727 as described above with respect to FIG. 7A. Additionally, the holder 1100 may include a channel 1109 and a pair of side protrusions 1105. Additionally, the side protrusions 1105 may each have a top protrusion surface 1103 and a bottom protrusion surface 1107.

In certain embodiments, the channel 1109 of the holder 1100, when not securing a phasing line, may have a diameter that is slightly less than the diameter of an associated phasing line. The insertion of a phasing line into the channel may cause the sides of the holder 1100 to pivot around the pivot section 1111, such that the distance between the side protrusions 1105 increases. In further embodiments, the top protrusion surface 1103 and the bottom protrusion surface 1107 may be sloped. For example, as the side protrusions 1105 extend away from the channel 1109, the distance between the top protrusion surface 1103 and the bottom protrusion surface 1107 may decrease.

FIG. 11B illustrates a specialized groove 1123 that is designed for use with a holder 1100. As shown, the specialized groove 1123 includes bottom surfaces, side surfaces, and an opening in a similar manner to the other grooves described above. In addition to the above-described surfaces, the groove 1123 may also include a pair of side grooves 1119. As illustrated, each side groove 1119 may include a top groove surface 1117 and a bottom groove surface 1121. Where the side groove 1119 is designed to receive the side protrusions 1105 when a holder 1100 is placed within a groove 1123.

FIGS. 12A and 12B illustrate the placement of a holder 1100 within a groove 1123 and the use of a phasing line 1125 to secure the position of the holder 1100 within the groove 1123. For example, FIG. 12A illustrates the placement of the holder 1100 within the groove 1123. In contrast to other embodiments discussed above, the holder 1100 is placed at a desired location in the groove 1123 before a phasing line 1125 is inserted into the channel 1109. Accordingly, the holder 1100 may be placed at a position within the channel such that the side protrusions 1105 extend into the corresponding side grooves 1119. Thus, the bottom protrusion surface 1107 may be proximately located to the bottom groove surface 1121, and the top protrusion surface 1103 (not shown in FIGS. 12A and 12B) may be proximately located to the top groove surface 1117.

In certain embodiments, when one or more holders 1100 are at the desired locations within the groove 1123, a phasing line 1125 may be inserted into the holder 1100. When the phasing line 1125 is inserted into the holders 1100 (as the diameter of the phasing line 1125 is larger than the diameter of the channel 1109) the external surfaces of the phasing line 1125 in contact with a holder 1100 may exert a force on the holder 1100 that pushes the side protrusions 1105 into the side grooves 1119. When the side protrusions 1105 are pushed into the side grooves 1119, the side protrusions 1105 may exert a force on the surfaces of the side grooves 1119. For example, when the top protrusion surface 1103 and the bottom protrusion surface 1107 are sloped, the pushing of the side protrusions 1105 into the corresponding side grooves 1119 may cause the top protrusion surface 1103 and the bottom protrusion surface 1107 to apply increasing force on the top groove surface 1117 and the bottom groove surface 1121 such that the position of the holder 1100 becomes fixed within the groove 1123. Accordingly, the phasing line 1125 causes the holder 1100 to exert a force on the sides of a groove as compared to the use of other objects described in other embodiments of the present disclosure, such as the insertion object 623 and the securing mechanisms 700b and 900b.

Figure 13:
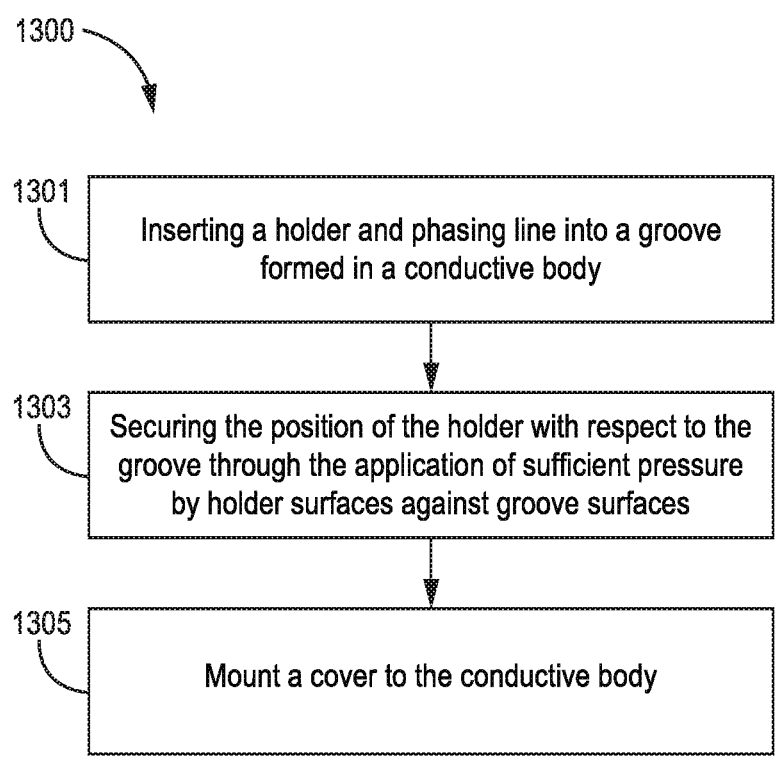
FIG. 13 is a flowchart diagram illustrating a method for securing a phasing line within a groove using a phasing line holder according to an aspect of the present disclosure.

FIG. 13 is a flowchart diagram showing an exemplary method 1300 for mounting a phasing line within a groove, such as the phasing line and holder combinations 400, 500, 600, and 900. Method 1300 proceeds at 1301, where a holder and phasing line are inserted into a groove formed in a conductive body. Additionally, method 1300 proceeds at 1303, where the position of the holder with respect to the groove is secured through the application of sufficient pressure by holder surfaces against groove surfaces. For example, an insertion object, a securing mechanism, or the phasing line itself may exert a force on the holder as described above, causing the holder to push against surfaces of the containing groove. Additionally, the groove may be specifically shaped to accommodate the holder. For example, the groove may have protrusions or grooves formed therein to facilitate the application of force on surfaces of grooves by the holder. When the holder is secured within the groove, the method 1300 proceeds at 1305, where a cover is mounted to the conductive body. The mounting of the cover to the conductive body may enclose the phasing line within the groove.

Figure 14:
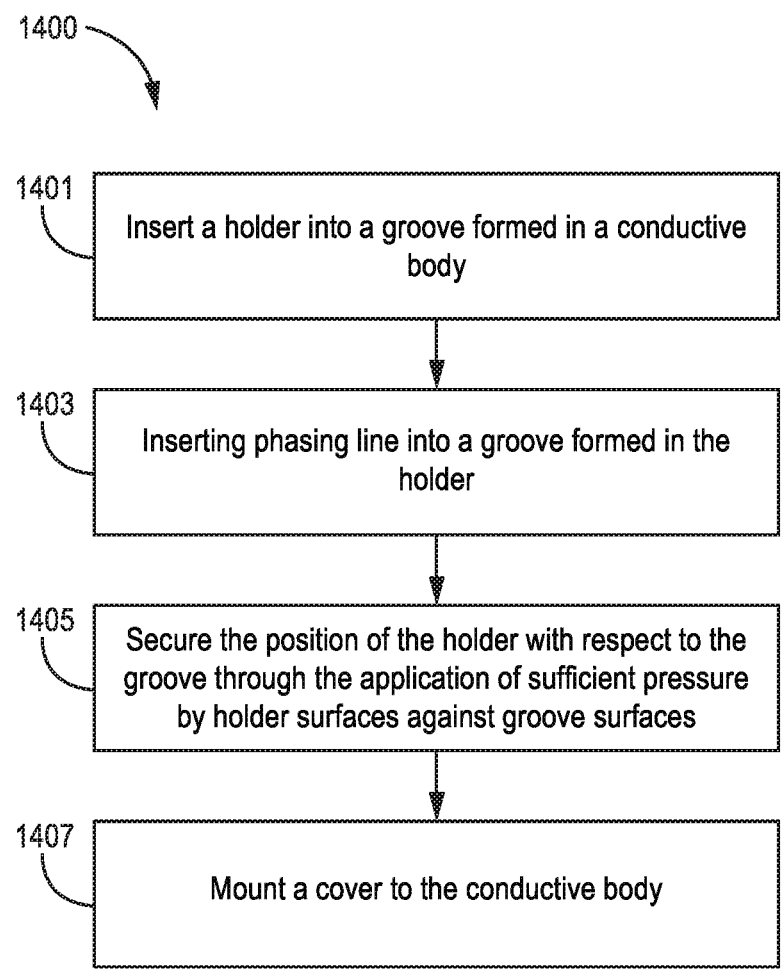
FIG. 14 is a flowchart diagram illustrating a method for securing a phasing line within a groove using a phasing line holder according to an aspect of the present disclosure.

FIG. 14 is a flowchart diagram showing an exemplary method 1400 for mounting a phasing line within a groove, such as the phasing line and holder combinations 700 and 1100. The method 1400 proceeds at 1401, where a holder is inserted into a groove formed in a conductive body. Moreover, the method 1400 proceeds at 1403, where a phasing line is inserted into a groove formed in the holder. Additionally, the method 1400 proceeds at 1405, where the position of the holder with respect to the groove is secured through the application of sufficient pressure by holder surfaces against groove surfaces. For example, an insertion object, a securing mechanism, or the phasing line itself may exert a force on the holder as described above, causing the holder to push against surfaces of the containing groove. Additionally, the groove may be specifically shaped to accommodate the holder. For example, the groove may have protrusions or grooves formed therein to facilitate the application of force on surfaces of grooves by the holder. When the holder is secured within the groove, the method 1400 proceeds at 1407, where a cover is mounted to the conductive body. The mounting of the cover to the conductive body may enclose the phasing line within the groove.

EXAMPLE EMBODIMENTS

Example 1 includes an apparatus comprising: a groove in a conductive body; a phasing line for electrically coupling a plurality of components, the phasing line extending through the groove; and a holder inserted into the groove, the holder maintaining the phasing line at a specific position in relation to a plurality of groove surfaces, wherein a plurality of holder surfaces apply sufficient pressure to the plurality of groove surfaces to secure the holder within the groove.

Example 2 includes the apparatus of Example 1, further comprising an insertion object, wherein the insertion object is inserted into a slot in the holder, the insertion object pushing opposite holder side surfaces in the plurality of holder surfaces against surfaces in the plurality of groove surfaces.

Example 3 includes the apparatus of Example 2, wherein the insertion object comprises: a specialized tip that slides into the slot in the holder and displaces the holder; and a forcing mechanism that pushes the specialized tip into the holder and maintains the specialized tip within the slot.

Example 4 includes the apparatus of any of Examples 1-3, wherein the holder includes: a holder base that supports the phasing line at the specific position; and a securing mechanism that physically couples to the holder base and is movably rotated to apply the sufficient pressure to the plurality of groove surfaces.

Example 5 includes the apparatus of Example 4, wherein pressure applied by the securing mechanism to the holder base increases the pressure applied by a plurality of holder base surfaces against contacting groove surfaces in the plurality of groove surfaces.

Example 6 includes the apparatus of any of Examples 4-5, wherein a top surface of the securing mechanism applies pressure to bottom surfaces on a plurality of protrusions in the groove when the securing mechanism is in a locked position, and the securing mechanism fits between the grooves when the securing mechanism is in an unlocked position.

Example 7 includes the apparatus of any of Examples 4-6, wherein edges of the securing mechanism extend into a plurality of side grooves formed in side surfaces of the groove when the securing mechanism is in a locked position.

Example 8 includes the apparatus of any of Examples 1-7, wherein the holder includes at least one pivot section, where the pivot section facilitates bending of the holder about the pivot section.

Example 9 includes the apparatus of any of Examples 1-8, wherein the holder is made from a plastic material.

Example 10 includes the apparatus of any of Examples 1-9, wherein the phasing line pushes the plurality of holder surfaces against the plurality of groove surfaces.

Example 11 includes the apparatus of Example 10, wherein the holder comprises a plurality of protrusions that extend into a plurality of side grooves in the groove, wherein pressure applied by the phasing line to the holder increases the pressure applied by the plurality of protrusions to the surfaces of the plurality of side grooves.

Example 12 includes a method comprising: inserting a holder and phasing line into a groove formed in a conductive body, wherein the holder maintains the phasing line at a specific position in relation to a plurality of groove surfaces; securing the position of the holder with respect to the groove through application of sufficient pressure by a plurality of holder surfaces against the plurality of groove surfaces; and mounting a cover to the conductive body to enclose the groove.

Example 13 includes the method of Example 12, wherein securing the position of the holder comprises: inserting an insertion object into a slot in the holder, wherein a portion of the insertion object pushes against the holder causing opposite holder side surfaces in the plurality of holder surfaces to push against proximate groove surfaces in the plurality of groove surfaces; and securing the insertion object within the slot.

Example 14 includes the method of any of Examples 12-13, wherein inserting the holder and the phasing line into the groove comprises inserting a holder base and the phasing line into the groove.

Example 15 includes the method of Example 14, wherein securing the position of the holder with respect to the groove comprises: inserting a securing mechanism into a portion of the holder base, the securing mechanism in an unlocked position; rotating the securing mechanism into a locked position, wherein surfaces of the securing mechanism apply pressure against the plurality of groove surfaces.

Example 16 includes the method of Example 15, wherein a top surface of the securing mechanism applies pressure to bottom surfaces on a plurality of protrusions in the groove when the securing mechanism is in the locked position, and the securing mechanism fits between the grooves when the securing mechanism is in the unlocked position.

Example 17 includes the method of any of Examples 15-16, wherein edges of the securing mechanism extend into a plurality of side grooves formed in side surfaces of the groove when the securing mechanism is in the locked position.

Example 18 includes the method of any of Examples 12-17, wherein inserting the holder and the phasing line into the groove secures the position of the holder with respect to the groove, wherein the holder comprises a plurality of protrusions that extend into a plurality of side grooves in the groove, wherein pressure applied by the phasing line to the holder increases the pressure applied by the plurality of protrusions to the surfaces of the plurality of side grooves.

Example 19 includes the method of any of Examples 12-18, wherein the holder comprises at least one pivot section, where the pivot section facilitates bending of the holder about a pivot point.

Example 20 includes a system comprising: a conductive body having at least one groove formed therein; one or more phasing lines extending through the at least one groove at a specific position in relation to a plurality of surfaces of the at least one groove; one or more holders located in the at least one groove, wherein the one or more holders keep the one or more phasing lines at the specific position, wherein a plurality of holder surfaces apply sufficient pressure to the plurality of groove surfaces to secure the one or more holders within the groove; and a cover mounted to the conductive body, wherein the cover encloses the one or more phasing lines and the one or more holders within the at least one groove.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. An apparatus comprising:
   a groove in a conductive body;
   a phasing line for electrically coupling a plurality of components, the phasing line extending through the groove; and
   a holder inserted into the groove, the holder maintaining the phasing line at a specific position in relation to a plurality of groove surfaces, wherein a plurality of holder surfaces apply sufficient pressure to the plurality of groove surfaces to secure the holder within the groove.

2. The apparatus of claim 1, further comprising an insertion object, wherein the insertion object is inserted into a slot in the holder, the insertion object pushing opposite holder side surfaces in the plurality of holder surfaces against surfaces in the plurality of groove surfaces.

3. The apparatus of claim 2, wherein the insertion object comprises:
   a specialized tip that slides into the slot in the holder and displaces the holder; and
   a forcing mechanism that pushes the specialized tip into the holder and maintains the specialized tip within the slot.

4. The apparatus of claim 1, wherein the holder includes:
   a holder base that supports the phasing line at the specific position; and
   a securing mechanism that physically couples to the holder base and is movably rotated to apply the sufficient pressure to the plurality of groove surfaces.

5. The apparatus of claim 4, wherein pressure applied by the securing mechanism to the holder base increases the pressure applied by a plurality of holder base surfaces against contacting groove surfaces in the plurality of groove surfaces.

6. The apparatus of claim 4, wherein a top surface of the securing mechanism applies pressure to bottom surfaces on a plurality of protrusions in the groove when the securing mechanism is in a locked position, and the securing mechanism fits between the grooves when the securing mechanism is in an unlocked position.

7. The apparatus of claim 4, wherein edges of the securing mechanism extend into a plurality of side grooves formed in side surfaces of the groove when the securing mechanism is in a locked position.

8. The apparatus of claim 1, wherein the holder includes at least one pivot section, where the pivot section facilitates bending of the holder about the pivot section.

9. The apparatus of claim 1, wherein the holder is made from a plastic material.

10. The apparatus of claim 1, wherein the phasing line pushes the plurality of holder surfaces against the plurality of groove surfaces.

11. The apparatus of claim 10, wherein the holder comprises a plurality of protrusions that extend into a plurality of side grooves in the groove, wherein pressure applied by the phasing line to the holder increases the pressure applied by the plurality of protrusions to the surfaces of the plurality of side grooves.

12. A method comprising:
inserting a holder and phasing line into a groove formed in a conductive body, wherein the holder maintains the phasing line at a specific position in relation to a plurality of groove surfaces;
securing the position of the holder with respect to the groove through application of sufficient pressure by a plurality of holder surfaces against the plurality of groove surfaces; and
mounting a cover to the conductive body to enclose the groove.

13. The method of claim 12, wherein securing the position of the holder comprises:
inserting an insertion object into a slot in the holder, wherein a portion of the insertion object pushes against the holder causing opposite holder side surfaces in the plurality of holder surfaces to push against proximate groove surfaces in the plurality of groove surfaces; and
securing the insertion object within the slot.

14. The method of claim 12, wherein inserting the holder and the phasing line into the groove comprises inserting a holder base and the phasing line into the groove.

15. The method of claim 14, wherein securing the position of the holder with respect to the groove comprises:
inserting a securing mechanism into a portion of the holder base, the securing mechanism in an unlocked position;
rotating the securing mechanism into a locked position, wherein surfaces of the securing mechanism apply pressure against the plurality of groove surfaces.

16. The method of claim 15, wherein a top surface of the securing mechanism applies pressure to bottom surfaces on a plurality of protrusions in the groove when the securing mechanism is in the locked position, and the securing mechanism fits between the grooves when the securing mechanism is in the unlocked position.

17. The method of claim 15, wherein edges of the securing mechanism extend into a plurality of side grooves formed in side surfaces of the groove when the securing mechanism is in the locked position.

18. The method of claim 12, wherein inserting the holder and the phasing line into the groove secures the position of the holder with respect to the groove, wherein the holder comprises a plurality of protrusions that extend into a plurality of side grooves in the groove, wherein pressure applied by the phasing line to the holder increases the pressure applied by the plurality of protrusions to the surfaces of the plurality of side grooves.

19. The method of claim 12, wherein the holder comprises at least one pivot section, where the pivot section facilitates bending of the holder about a pivot point.

20. A system comprising:
a conductive body having at least one groove formed therein;
one or more phasing lines extending through the at least one groove at a specific position in relation to a plurality of surfaces of the at least one groove;
one or more holders located in the at least one groove, wherein the one or more holders keep the one or more phasing lines at the specific position, wherein a plurality of holder surfaces apply sufficient pressure to the plurality of groove surfaces to secure the one or more holders within the groove; and
a cover mounted to the conductive body, wherein the cover encloses the one or more phasing lines and the one or more holders within the at least one groove.

* * * * *